United States Patent
Takaya et al.

(10) Patent No.: US 7,804,127 B2
(45) Date of Patent: Sep. 28, 2010

(54) SEMICONDUCTOR NON-VOLATILE MEMORY HAVING SEMICONDUCTOR NON-VOLATILE MEMORY CELL WITH ELECTRIC CHARGE ACCUMULATION LAYER, AND METHOD OF PRODUCING THE SAME

(75) Inventors: Koji Takaya, Tokyo (JP); Akiyuki Minami, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 12/155,983

(22) Filed: Jun. 12, 2008

(65) Prior Publication Data

US 2009/0045454 A1    Feb. 19, 2009

(30) Foreign Application Priority Data

Aug. 16, 2007    (JP) .............................. 2007-212101

(51) Int. Cl.
*H01L 29/792* (2006.01)
(52) U.S. Cl. .............................. 257/324; 257/E29.052
(58) Field of Classification Search ................. 257/324, 257/350, E29.052; 365/185.03
See application file for complete search history.

(56) References Cited

U.S. PATENT DOCUMENTS

2005/0194616 A1*  9/2005  Yoon et al. .................. 257/213
2006/0029887 A1*  2/2006  Oh et al. ...................... 430/311
2008/0197404 A1*  8/2008  Takaya ......................... 257/324

FOREIGN PATENT DOCUMENTS

| JP | 03-082053   | 4/1991 |
|----|-------------|--------|
| JP | 2004-088101 | 3/2004 |
| JP | 2004-128185 | 4/2004 |
| JP | 2006-024680 | 1/2006 |
| JP | 2007-049119 | 2/2007 |

* cited by examiner

*Primary Examiner*—Thomas L Dickey
(74) *Attorney, Agent, or Firm*—Kubotera & Associates LLC

(57) ABSTRACT

A semiconductor non-volatile memory cell includes an Si (silicon) layer containing substrate including an activation region having a ridge portion; an element separation region embedded in both sides of the activation region; a gate electrode with a gate insulation film inbetween formed over the ridge portion for covering a part of both side surfaces of the ridge portion and an upper surface of the element separation region; a channel forming region formed in a surface layer region of the ridge portion; an extension region formed on both sides of the channel forming region in the longitudinal direction; and an electric charge accumulation layer capable of accumulating electric charges and a sidewall formed on the extension region and one or both of side surfaces of the gate electrode facing with each other in the longitudinal direction.

8 Claims, 13 Drawing Sheets

SEMICONDUCTOR NON-VOLATILE MEMORY HAVING SEMICONDUCTOR NON-VOLATILE MEMORY CELL WITH ELECTRIC CHARGE ACCUMULATION LAYER, AND METHOD OF PRODUCING THE SAME

BACKGROUND OF THE INVENTION AND RELATED ART STATEMENT

The present invention relates to a semiconductor non-volatile memory cell, a method of producing the semiconductor non-volatile memory cell, a semiconductor non-volatile memory having the semiconductor non-volatile memory cell, and a method of producing the semiconductor non-volatile memory.

Conventionally, a semiconductor non-volatile memory cell is an element of a semiconductor non-volatile memory. The semiconductor non-volatile memory cell is categorized in two types, i.e., a semiconductor non-volatile memory cell having a planer structure and a semiconductor non-volatile memory having a three-dimensional structure.

Patent Reference 1 has disclosed a conventional semiconductor non-volatile memory cell 1000 having a planer structure. FIG. 12 is a schematic sectional view showing the conventional semiconductor non-volatile memory cell having the planer structure. As shown in FIG. 12, an electric charge accumulation portion formed of a laminated insulation layer is disposed on a sidewall portion of a gate electrode of an NMOSFET (N-type Metal Oxide Semiconductor Field Effect Transistor).

Patent Reference 1: Japanese Patent Publication No. 2006-24680

In the conventional semiconductor non-volatile memory cell 1000 having the planer structure, a drain region 1021 of an n+ type and a source region 1022 of the n+ type are separately formed in a p-well 1011 formed on a p-type silicon substrate 1010. A channel forming region 1012 is disposed between the drain region 1021 and the source region 1022.

A gate insulation film 1013 is formed on the channel forming region 1012, and a gate electrode 1030 is formed on the gate insulation film 1013. A first resistivity changing portion 1023 is disposed between the drain region 1021 and the channel forming region 1012. A first electric charge accumulation portion 1050 is formed on the first resistivity changing portion 1023. The first electric charge accumulation portion 1050 is formed of a silicon oxide film 1042, a silicon nitride film 1042, and a silicon oxide film 1043.

A second resistivity changing portion 1026 is disposed between the source region 1022 and the channel forming region 1012. A second electric charge accumulation portion 1052 is formed on the second resistivity changing portion 1026. The second electric charge accumulation portion 1052 is formed of a silicon oxide film 1044, a silicon nitride film 1045, and a silicon oxide film 1046.

When the conventional semiconductor non-volatile memory cell 1000 having the planer structure is operated, hot carriers are introduced into the first electric charge accumulation portion 1050 or the second electric charge accumulation portion 1052, thereby recording electric charges thus accumulated as information. More specifically, a state that the electric charges are accumulated, or a state that the electric charges are not accumulated, corresponds to a logic value "0" or "1", thereby making it possible to record one bit information.

It is possible to determine whether the electric charges are accumulated in the first electric charge accumulation portion 1050 through the following phenomena. When the electric charges are accumulated in the first electric charge accumulation portion 1050, a resistivity of the first resistivity changing portion 1023 increases. Accordingly, an electric current flowing between the source region 1022 and the drain region 1021 decreases.

On the other hand, when the electric charges are not accumulated in the first electric charge accumulation portion 1050, a resistivity of the first resistivity changing portion 1023 decreases. Accordingly, a sufficient amount of an electric current flows between the source region 1022 and the drain region 1021.

When the electric charges are accumulated, a positive voltage is applied to the source region 1022 and the drain region 1021, and the source region 1022 is set to be ground voltage. In the above description, information is recorded in the first electric charge accumulation portion 1050, and information may be recorded in the first electric charge accumulation portion 1050 through a similar process.

Patent Reference 2 or 3 has disclosed a semiconductor non-volatile memory cell having a fin-type transistor 2000 as an example of a conventional semiconductor non-volatile memory cell having a three-dimensional structure. FIG. 13 is a schematic perspective view showing the fin-type transistor 2000.

Patent Reference 2: Japanese Patent Publication No. 2004-88101

Patent Reference 3: Japanese Patent Publication No. 2004-128185

As shown in FIG. 13, the conventional semiconductor non-volatile memory cell is characterized in that a gate electrode is formed to cover a top portion and a side portion of an Si (Silicon) substrate or an SOI (Silicon On Insulator) substrate having a fin shape protruding in a vertical direction.

More specifically, in the fin-type transistor 2000, an SOI substrate is formed of a silicon substrate 2010, an embedded silicon oxide film 2011, and an SOI layer as an uppermost layer. The SOI layer is processed to form a silicon fin 2012 on the embedded silicon oxide film 2011. A gate oxide film 2013 is formed on surfaces of the embedded silicon oxide film 2011 and the silicon fin 2012.

The silicon fin 2012 has a size according to a generation of device development, and has typically a width of about 15 nm and a height of about 50 nm. A gate electrode 2014 is disposed to cover a part of the silicon fin 2012 with the gate oxide film 2013 formed thereon.

Further, a source region (not shown in FIG. 13) and a drain region 2016 are formed on portions of the silicon fin 2012 where the gate oxide film 2013 is removed, so that the source region and the drain region 2016 sandwich the gate electrode 2014 at a middle portion in a longitudinal direction of the silicon fin 2012. Note that, in the conventional semiconductor non-volatile memory cell having the three-dimensional structure, a portion corresponding to the electric charge accumulation layer of the conventional semiconductor non-volatile memory cell having the planer structure is disposed at a position other than the transistor portion, thereby not being shown in FIG. 13.

With the configuration described above, a channel width of the transistor is determined by the side surface and the top surface of the fin, and becomes substantially longer than a width of the top surface of the fin, i.e., a layout width. Accordingly, as opposed to the transistor having the planer structure, the fin-type transistor has an increased current drive power. As a result, it is possible to alleviate a problem of decrease in a current value of the transistor due to a decrease in a channel width of the conventional semiconductor non-volatile memory cell having the planer structure.

When a memory cell region having a memory element and a peripheral region having a peripheral element are integrated to from a semiconductor memory, it is difficult to uniformly flatten in a flattening process due to a difference in trench pattern densities between the memory cell region and the peripheral region. To solve the problem, Patent Reference 4 or 5 has proposed a method, in which a dummy trench pattern or a dummy active is formed in an intermediate region, where no insulation separation is necessary, between the memory cell region and the peripheral region, thereby performing the flattening process uniformly.

Patent Reference 4: Japanese Patent Publication No. 03-82053

Patent Reference 5: Japanese Patent Publication No. 2007-49119

Recently, with an advancement of a scaling such as a reduction in a size of a gate electrode through reducing a size of an element, the conventional semiconductor non-volatile memory cell having the planer structure tends to have a short channel effect due to a reduction in a gate electrode length or a gate electrode width.

In order to reduce the short channel effect, it is necessary to increase an impurity concentration of the channel. As a result, a mobility of carriers tends to decrease, or a current value of the transistor tends to decrease, thereby deteriorating a characteristic or function of the conventional semiconductor non-volatile memory cell.

In the fin-type transistor, it is possible to utilize the both sides of the fin, and to prevent the problem of the reduction in a current value of the transistor due to the reduction in the channel width, which occurs in the conventional semiconductor non-volatile memory cell having the planer structure. However, it is necessary to provide the electric charge accumulation portion at a position other than the transistor portion.

Further, when the fin-type transistor with a good transistor characteristic is mounted as the conventional semiconductor non-volatile memory cell together with a peripheral element to form the conventional semiconductor non-volatile memory cell, it is possible to solve the problems of the insulation separation or the flattening process described above through a well-known STI (Shallow Trench Isolation) method, a CMP (Chemical Mechanical Polishing) method, or an etch-back method.

In this case, however, when a film covering the memory cell is patterned, a portion of the film thus etched may adhere again to a step portion, in particular, a lower step portion at an edge portion of the memory cell adjacent to the peripheral element, thereby causing a short circuit at the step portion. Accordingly, a yield or reliability of the conventional semiconductor non-volatile memory cell is deteriorated.

In view of the problems described above, an object of the present invention is to provide a semiconductor non-volatile memory cell and a method of producing the semiconductor non-volatile memory cell capable of solving the problems of the conventional semiconductor non-volatile memory cell. In the semiconductor non-volatile memory cell, it is possible to provide an electric charge accumulation portion, and to obtain high current efficiency.

Further, another object of the present invention is to provide a semiconductor non-volatile memory and a method of producing the semiconductor non-volatile memory with a high yield and improved reliability, in which it is possible to easily integrate the semiconductor non-volatile memory cell and a peripheral element.

Further objects and advantages of the invention will be apparent from the following description of the invention.

SUMMARY OF THE INVENTION

In order to attain the objects described above, according to a first aspect of the present invention, a semiconductor non-volatile memory cell includes an Si (silicon) layer containing substrate including an activation region having a ridge shape arranged in a stripe pattern; an element separation region embedded in both sides of the activation region so that a ridge portion protrudes from an upper end portion of the activation region; a gate electrode with a gate insulation film inbetween extending in a direction perpendicular to a longitudinal direction of the ridge portion of the activation region and formed over an upper surface of the ridge portion for covering at least a part of both side surfaces of the ridge portion and an upper surface of the element separation region; a channel forming region formed in a surface layer region of the ridge portion at a position facing the gate electrode; an extension region formed on both sides of the channel forming region in the longitudinal direction of the ridge portion; and an electric charge accumulation layer capable of accumulating electric charges and a sidewall sequentially formed on the extension region and one or both of side surfaces of the gate electrode facing with each other in the longitudinal direction of the ridge portion.

In the semiconductor non-volatile memory cell, the electric charge accumulation layer may be formed of an ONO laminated insulation film formed of three layers of a silicon oxide film, a silicon nitride film, and a silicon oxide film.

According to a second aspect of the present invention, a method of producing a semiconductor non-volatile memory cell includes the following first to eighth steps.

In the first step, an activation region having a ridge shape and protruding from an Si layer containing substrate is formed in a stripe pattern. Then, an insulation film is embedded in both sides of the activation region to form a precursor element separation region.

In the second step, the precursor element separation region is etched from a surface thereof to a middle of a thickness thereof to form an element separation region. Further, an upper edge portion of the activation region is formed to protrude as a ridge portion.

In the third step, a precursor gate insulation film and a gate electrode material are sequentially deposited for covering exposed surfaces of the ridge portion and the element separation region from above. Then, a surface of the gate electrode material is flattened to form a gate electrode layer.

In the fourth step, the precursor gate insulation film and the gate electrode layer are patterned to form a gate insulation film and a gate electrode extending perpendicularly to a longitudinal direction of the ridge portion and covering over the ridge portion, and at least a part of both side surfaces of the ridge portion and the element separation region.

In the fifth step, a channel forming region is defined in a surface layer region of the ridge portion at a position facing the gate electrode.

In the sixth step, an impurity is diffused in the activation region on the both sides of the channel forming region in the longitudinal direction of the ridge portion to form an extension region.

In the seventh step, a precursor electric charge accumulation layer and a sidewall insulation film are sequentially deposited for covering the ridge portion and the element separation region including the gate electrode and the extension region.

In the eighth step, the precursor electric charge accumulation layer and the sidewall insulation film are patterned to form an electric charge accumulation layer and a sidewall on the extension region and one or both of side surfaces of the gate electrode facing with each other in the longitudinal direction of the ridge portion.

In the method of producing the semiconductor non-volatile memory cell, in the seventh step, the precursor electric charge accumulation layer is deposited as an ONO laminated insulation film formed of three layers of a silicon oxide film, a silicon nitride film, and a silicon oxide film.

According to a third aspect of the present invention, a semiconductor non-volatile memory includes a memory cell region having a semiconductor non-volatile memory cell; a peripheral region having a peripheral transistor; and a dummy region having a dummy activation region.

In the third aspect of the present invention, the semiconductor non-volatile memory cell includes an Si (silicon) layer containing substrate including a first activation region having a ridge shape arranged in a stripe pattern; a first element separation region embedded in both sides of the first activation region so that a ridge portion protrudes from an upper end portion of the first activation region; a first gate electrode with a first gate insulation film inbetween extending in a direction perpendicular to a longitudinal direction of the ridge portion of the first activation region and formed over an upper surface of the ridge portion for covering at least a part of both side surfaces of the ridge portion and an upper surface of the first element separation region; a first channel forming region formed in a surface layer region of the ridge portion at a position facing the first gate electrode; a first extension region formed on both sides of the first channel forming region in the longitudinal direction of the ridge portion; and an electric charge accumulation layer capable of accumulating electric charges and a first sidewall sequentially formed on the first extension region and one or both of side surfaces of the first gate electrode facing with each other in the longitudinal direction of the ridge portion.

In the third aspect of the present invention, the peripheral transistor includes a second activation region having a ridge shape and arranged on the Si layer containing substrate in a stripe pattern; a second element separation region formed on the Si layer containing substrate and embedded in the second activation region so that the second element separation region has a height same as an upper surface of the second activation region; a second gate electrode with a second gate insulation film inbetween extending in a direction perpendicular to a longitudinal direction of the second activation region for covering the second activation region and at least a part of the second element separation region; a second channel forming region formed in a surface layer region of the second activation region at a position facing the second gate electrode; a second extension region formed on both sides of the second channel forming region in the longitudinal direction of the second activation region; and a laminated layer film and a second sidewall sequentially formed on the second extension region and one or both of side surfaces of the second gate electrode facing with each other in the longitudinal direction of the second activation region.

In the third aspect of the present invention, the dummy activation region is formed in the dummy region as an intermediate region between the memory cell region and the peripheral region on the Si layer containing substrate. Further, the dummy activation region is arranged in parallel to the second element separation region and the second activation region of the peripheral transistor on a plane same as that of the second element separation region and the second activation region of the peripheral transistor.

In the semiconductor non-volatile memory, it is preferred that the first gate insulation film and the first gate electrode are arranged separately from the second gate insulation film and the second gate electrode in the dummy activation region.

In the semiconductor non-volatile memory, it is preferred that the electric charge accumulation layer and the laminated layer film are formed of an ONO laminated insulation film formed of three layers of a silicon oxide film, a silicon nitride film, and a silicon oxide film, respectively.

In the semiconductor non-volatile memory, it is preferred that the electric charge accumulation layer and the first sidewall are arranged separately from the laminated layer film and the second sidewall in the dummy activation region.

According to a fourth aspect of the present invention, a method of producing a semiconductor non-volatile memory includes the following first to tenth steps. The semiconductor non-volatile memory includes a memory cell region having a semiconductor non-volatile memory cell; a peripheral region having a peripheral transistor; and a dummy region having a dummy activation region.

The memory cell region, the peripheral region, and the dummy region as an intermediate region between the memory cell region and the peripheral region are defined on a surface of a Si layer containing substrate in advance.

In the first step, a first activation region having a ridge shape and a precursor first element separation region formed of a first embedded insulation film embedded in both sides of the first activation region are formed in the memory cell region in a stripe pattern, respectively. The dummy activation region having a ridge shape is formed in the dummy region in a stripe pattern. A second activation region having a ridge shape and a second element separation region formed of a second embedded insulation film embedded in both sides of the second activation region are formed in the peripheral region in a stripe pattern, respectively.

In the second step, the precursor first element separation region is etched from a surface thereof to a middle of a thickness thereof to form a first element separation region. Further, an upper edge portion of the first activation region is formed to protrude as a ridge portion.

In the third step, a gate insulation film and a gate electrode material are sequentially deposited for covering exposed surfaces of the memory cell region, the dummy region, and the peripheral region from above. Then, a surface of the gate electrode material is flattened to form a gate electrode layer.

In the fourth step, portions of the gate insulation film and the gate electrode layer in the peripheral region and the dummy region adjacent to the peripheral region are patterned to form a second gate insulation film and a second gate electrode extending perpendicularly to a longitudinal direction of the second activation region and covering at least a part of the second activation region, the second element separation region, and the dummy activation region.

In the fifth step, remaining portions of the gate insulation film and the gate electrode layer in the memory cell region and a remaining area of the dummy region are patterned to form a first gate insulation film and a first gate electrode extending perpendicularly to a longitudinal direction of the ridge portion and covering over the ridge portion, and at least a part of both side surfaces of the ridge portion, the first element separation region, and the dummy activation region.

In the sixth step, a first channel forming region is defined in a surface layer region of the ridge portion at a position facing the first gate electrode. A second channel forming region is defined in a surface layer region of the second activation region at a position facing the second gate electrode.

In the seventh step, a first impurity is diffused in the first activation region on the both sides of the first channel forming region in the longitudinal direction of the ridge portion to form a first extension region. A second impurity is diffused in the second activation region on the both sides of the second channel forming region in the longitudinal direction of the second activation region to form a second extension region.

In the eighth step, a precursor electric charge accumulation layer and a sidewall insulation film are sequentially deposited for covering upper surfaces of the memory cell region, the dummy region, and the peripheral region.

In the ninth step, portions of the precursor electric charge accumulation layer and the sidewall insulation film in the peripheral region and the dummy region adjacent to the peripheral region are patterned to form a laminated layer film not used as an electric charge accumulation layer and a second sidewall on the second extension region and one or both of side surfaces of the second gate electrode in the longitudinal direction of the second activation region.

In the tenth step, remaining portions of the precursor electric charge accumulation layer and the sidewall insulation film in the memory cell region and a remaining area of the dummy region are patterned to form an electric charge accumulation layer and a first sidewall on the first extension region and one or both of side surfaces of the first gate electrode facing in the longitudinal direction of the ridge portion.

In the method of producing the semiconductor non-volatile memory, in the fourth step and the fifth step, it is preferred that the first gate insulation film is arranged separately from the second gate insulation film in the dummy activation region, and the first gate electrode is arranged separately from the second gate electrode in the dummy activation region.

In the method of producing the semiconductor non-volatile memory, in the eighth step, it is preferred that the precursor electric charge accumulation layer is formed of an ONO laminated insulation film formed of three layers of a silicon oxide film, a silicon nitride film, and a silicon oxide film.

In the method of producing the semiconductor non-volatile memory, in the ninth and tenth steps, it is preferred that the electric charge accumulation layer is arranged separately from the laminated layer film in the dummy activation region, and the first sidewall is arranged separately from the second sidewall in the dummy activation region.

As described above, in the semiconductor non-volatile memory cell and the method of producing the semiconductor non-volatile memory cell of the present invention, the gate electrode of the transistor is formed over the ridge portion. Accordingly, it is possible to substantially increase a gate length of the transistor as opposed to a plane layout width, thereby significantly increasing a drive current value of the transistor.

Further, the electric charge accumulation layer is formed on the three surfaces, i.e., the upper surface of the ridge portion and the side surfaces of the ridge portion. Accordingly, it is possible to efficiently change a current value for operating the memory cell. As a result, it is possible to increase a reading current difference before and after writing in the memory cell.

In the semiconductor non-volatile memory and the method of producing the semiconductor non-volatile memory of the present invention, edges of the semiconductor non-volatile memory cell and the peripheral transistor are separated on the dummy activation region with no base step. Accordingly, in addition to the effects in the semiconductor non-volatile memory cell and the method of producing the semiconductor non-volatile memory cell, it is possible to prevent a portion of the film from adhering again after the film is removed through etching. As a result, it is possible to prevent a short circuit at an edge of the memory cell, thereby improving a yield and reliability of the semiconductor non-volatile memory.

BRIEF DESCRIPTION OF THE DRAWINGS

FIGS. 2(A) and 2(B) are schematic sectional views showing the semiconductor non-volatile memory cell according to the embodiment of the present invention, wherein FIG. 2(A) is a schematic sectional view taken along a line 2(A) in FIG. 1, and FIG. 2(B) is a schematic sectional view taken along a line 2(B) in FIG. 1;

DETAILED DESCRIPTION OF PREFERRED EMBODIMENTS

Figure 1:
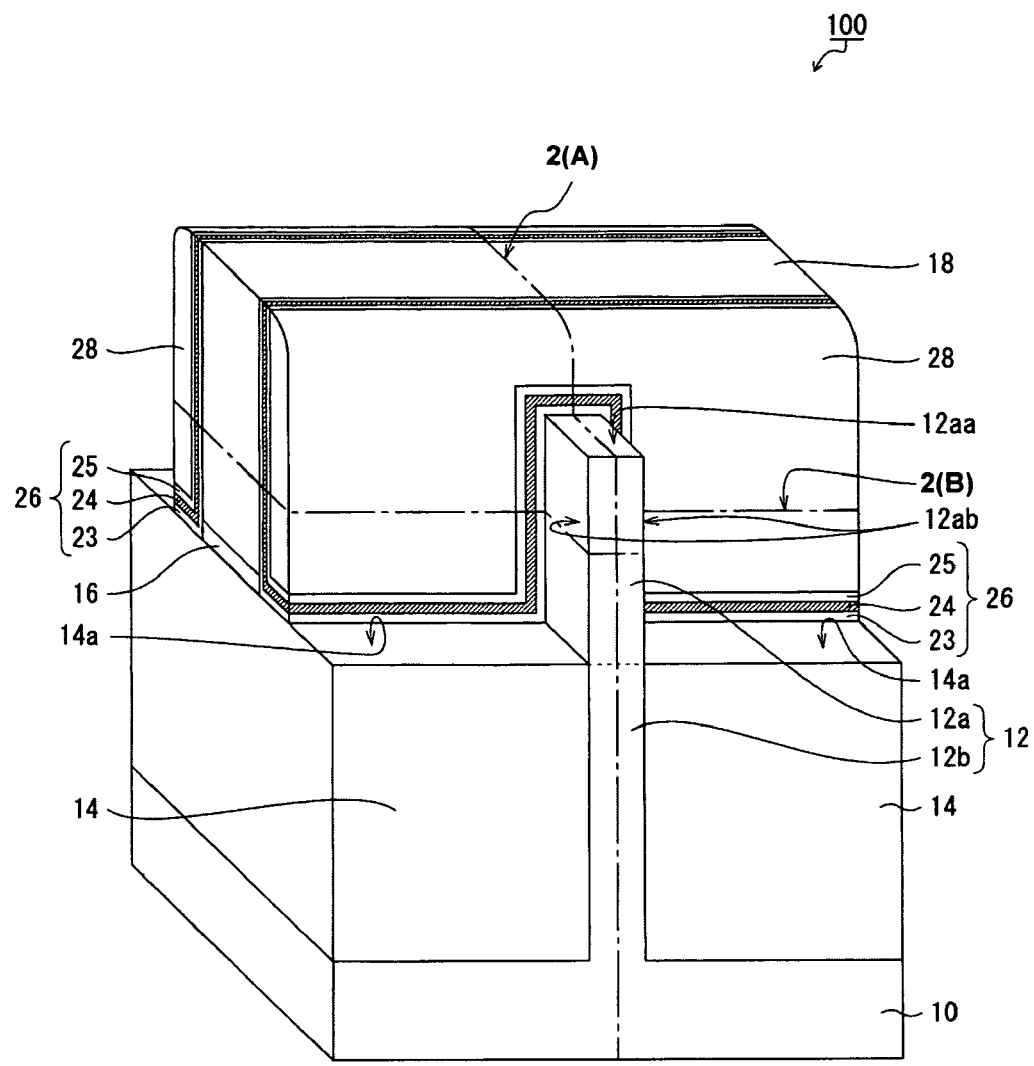
FIG. 1 is a schematic perspective view showing a semiconductor non-volatile memory cell according to an embodiment of the present invention.

Hereunder, embodiments of the present invention will be explained with reference to the accompanying drawings. In the following description of the present invention, each of the drawings is illustrated schematically in terms of a shape, a size, and a dimensional relationship for explaining the embodiments of the present invention, and the present invention is not limited to the shape, the size, and the dimensional relationship shown in the drawings.

According to an embodiment, with reference to FIGS. 1 to 11, the following description explains a semiconductor non-volatile memory cell, a method of producing the semiconductor non-volatile memory cell, a semiconductor non-volatile memory having the semiconductor non-volatile memory cell, and a method of producing the semiconductor non-volatile memory.

Figure 2A:
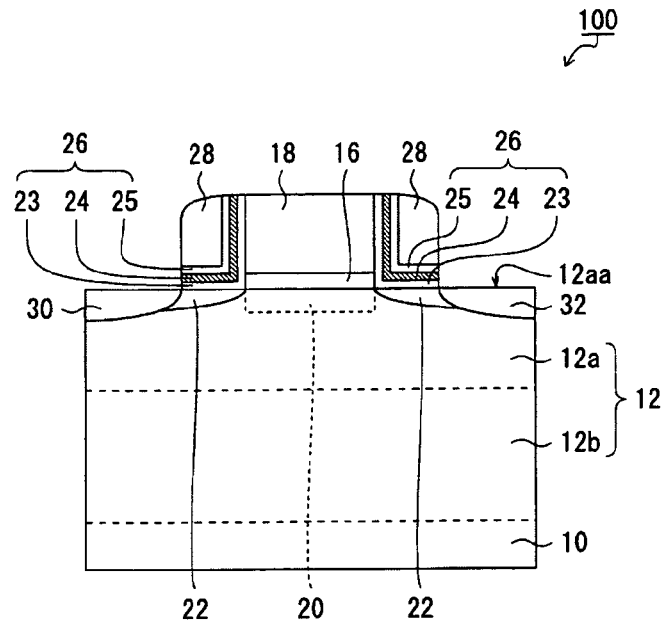
Figure 2B:
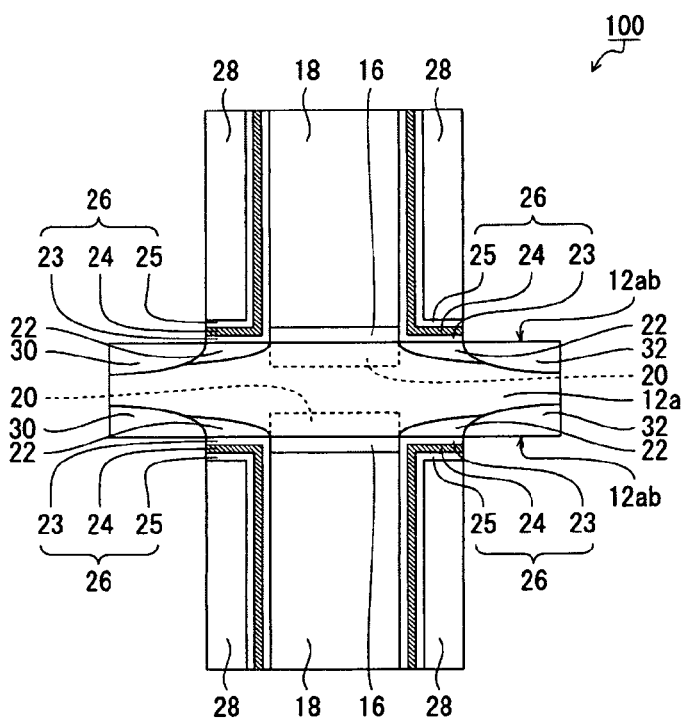

First, a configuration of the semiconductor non-volatile memory cell will be explained with reference to FIGS. 1, 2(A), and 2(B). FIG. 1 is a schematic perspective view showing a semiconductor non-volatile memory cell 100 according to the embodiment of the present invention. FIGS. 2(A) and 2(B) are schematic sectional views showing the semiconductor non-volatile memory cell 100 according to the embodiment of the present invention. More specifically, FIG. 2(A) is a schematic sectional view taken along a line 2(A) in FIG. 1, and FIG. 2(B) is a schematic sectional view taken along a line 2(B) in FIG. 1

In the embodiment, the semiconductor non-volatile memory cell 100 includes an Si (Silicon) layer containing substrate 10; a gate electrode 18; channel forming regions 20; extension regions 22; electric charge accumulation layers 26; and sidewalls 28. An Si substrate or an SOI (Silicon On Insulation) substrate may be used as the Si layer containing substrate 10, and the Si substrate is explained in the following description.

As shown in FIG. 1, an activation region 12 having a ridge shape is integrally disposed on a surface of the Si layer containing substrate 10 in a stripe pattern. Note that the activation region 12 may be disposed in a plurality of rows in parallel, and one row of the activation region 12 is shown in FIG. 1.

In the embodiment, element separation regions 14 are formed with a well-known STI (Shallow Trench Isolation) method on both sides of the activation region 12 on the surface of the Si layer containing substrate 10. The element separation regions 14 are embedded on a side of the activation region 12 facing the Si layer containing substrate 10, and an upper edge portion of the activation region 12 protrudes from upper surfaces 14a of the element separation regions 14 as a ridge portion 12a.

In the embodiment, the activation region 12 has an embedded portion 12a embedded between the element separation regions 14. The upper edge portion of the activation region 12, i.e., the ridge portion 12a, typically has a height of 50 nm and an upper surface with a width of 15 nm, different according to a device development generation.

In the embodiment, the gate electrode 18 is disposed to extend in a direction perpendicular to a stripe direction of the activation region 12 or a longitudinal direction of the ridge portion 12a. Accordingly, the gate electrode 18 straddles an upper surface 12aa of the ridge portion 12a of the activation region 12, and covers parts of side surfaces 12ab of the ridge portion 12a and the upper surfaces 14a of the element separation regions 14 with a gate insulation film 16 inbetween.

As a result, as opposed to a conventional transistor having a planer structure (refer to the section of BACKGROUND OF THE INVENTION AND RELATED ART STATEMENT), it is possible to increase a gate width of the transistor by a length corresponding to the side surfaces 12ab of the ridge portion 12a.

As shown in FIGS. 1, 2(A), and 2(B), the channel forming regions 20 are formed in a surface layer region of the activation region 12 at three locations, i.e., the upper surface 12aa of the ridge portion 12a and the side surfaces 12ab of the ridge portion 12a.

In the embodiment, the extension regions 22 are formed on both sides of the channel forming regions 20 in the longitudinal direction of the ridge portion 12a. An impurity of arsenic (As) is diffused in the extension regions 22 at a carrier concentration of $1 \times 10^{18}$ cm$^{-3}$. It is necessary to provide the extension regions 22 for electric field relaxation between a source region 30 and a drain region 32 as a transistor operation. In the semiconductor non-volatile memory cell, the extension regions 22 function as a first resistivity changing portion and a second resistivity changing portion of a conventional semiconductor non-volatile memory cell having a planer structure (refer to an explanation in the section of BACKGROUND OF THE INVENTION AND RELATED ART STATEMENT).

In the embodiment, the electric charge accumulation layers 26 and the sidewalls 28 are sequentially laminated on the extension regions 22 and side surfaces of the gate electrode 18. Each of the electric charge accumulation layers 26 is an ONO laminated insulation film formed of three layers of a silicon oxide film 23, a silicon nitride film 24, and a silicon oxide film 25 (refer to FIGS. 1, 2(A), and 2(B)).

In the embodiment, the silicon oxide film 23 has a thickness of 6.5 nm; the silicon nitride film 24 has a thickness of 5.0 nm; and the silicon oxide film 25 has a thickness of 6.5 nm. The sidewalls 28 are formed of a silicon nitride film having a thickness of 30 nm.

In the embodiment, the semiconductor non-volatile memory cell is characterized in that the gate electrode 18 is disposed to straddle the ridge portion 12a of the activation region 12, and the electric charge accumulation layers 26 are disposed on the side surfaces of the gate electrode 18. In other words, the semiconductor non-volatile memory cell has the configuration, in which the electric charge accumulation layers are integrated on side surfaces of a gate electrode of a fin-type transistor (refer to the section of BACKGROUND OF THE INVENTION AND RELATED ART STATEMENT).

In the embodiment, the source region 30 and the drain region 32 are formed in the activation region 12 on the both sides of the extension regions 22, respectively (refer to FIGS. 1, 2(A), and 2(B)). An impurity of arsenic (As) is diffused in the source region 30 and the drain region 32 at a carrier concentration of $1 \times 10^{21}$ cm$^{-3}$.

A method of producing the semiconductor non-volatile memory cell 100 will be explained next with reference to FIGS. 1 to 4(A)-4(B). In the following description, the components of the semiconductor non-volatile memory cell 100 described above are designated with the same reference numerals.

Figure 3A:
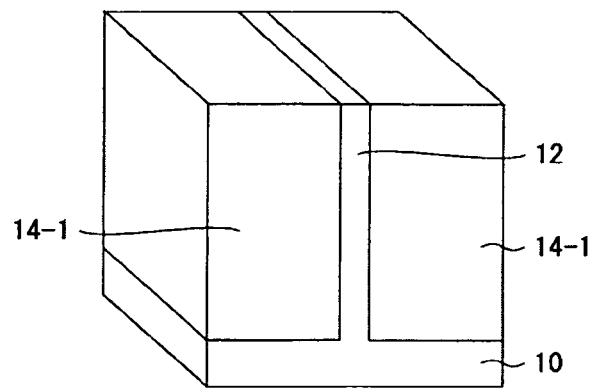
FIGS. 3(A) to 3(C) are schematic views No. 1 showing the semiconductor non-volatile memory cell during a manufacturing process thereof according to the embodiment of the present invention.
Figure 3B:
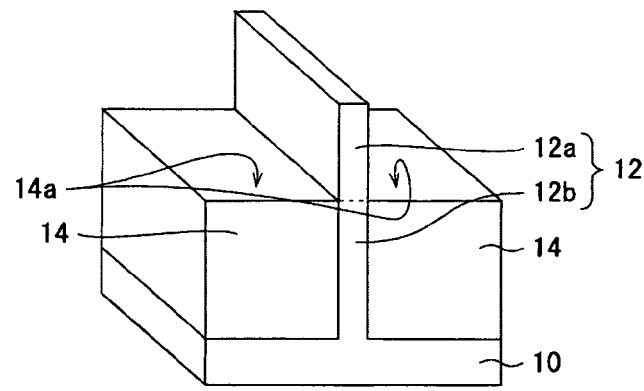
Figure 3C:
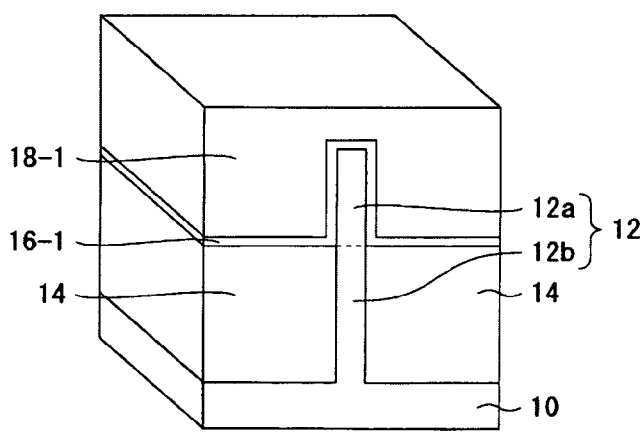
Figure 4A:
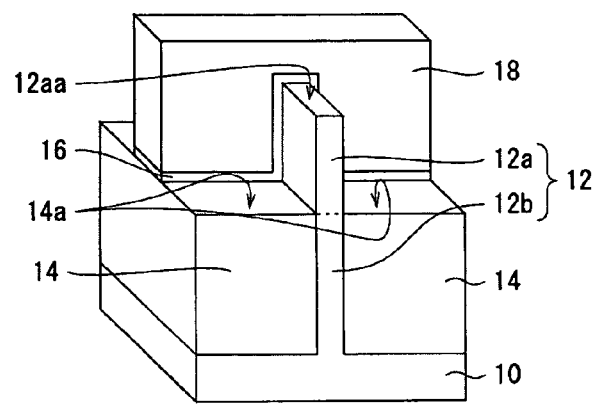
FIGS. 4(A) and 4(B) are schematic views No. 2 showing the semiconductor non-volatile memory cell during the manufacturing process thereof according to the embodiment of the present invention.
Figure 4B:
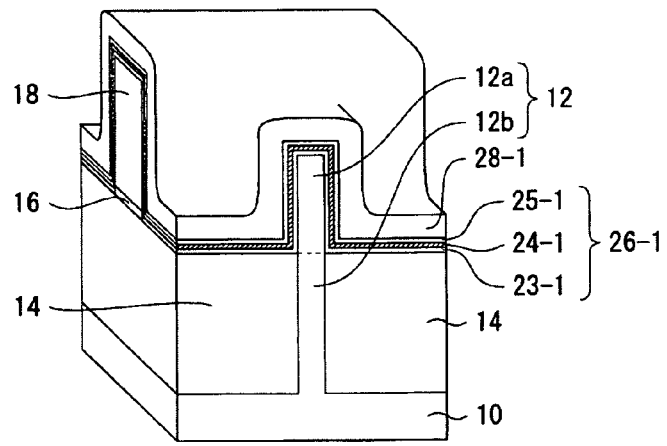

FIGS. 3(A) to 3(C) are schematic views No. 1 showing the semiconductor non-volatile memory cell 100 during a manufacturing process thereof according to the embodiment of the present invention. FIGS. 4(A) and 4(B) are schematic views No. 2 showing the semiconductor non-volatile memory cell 100 during the manufacturing process thereof according to the embodiment of the present invention.

The method of producing the semiconductor non-volatile memory cell 100 includes first to eighth steps.

In the first step, precursor element separation regions 14-1 are formed with a well-known STI method and a CMP (Chemical Mechanical Polishing) method as shown in FIG. 3(A). More specifically, the Si layer containing substrate 10 is prepared first, and then a surface of the Si layer containing substrate 10 is processed to form the activation region 12 having the ridge shape in the stripe pattern. Afterward, SiO$_2$ insulation films are embedded on the both sides of the activation region 12 to form the precursor element separation regions 14-1, thereby obtaining a structure shown in FIG. 3(A).

In the second step, the precursor element separation regions 14-1 are selectively etched from an upper surface of the structure obtained in the first step in a depth direction thereof, thereby obtaining a structure shown in FIG. 3(B). Through etching selectively, the $SiO_2$ insulation films forming the precursor element separation regions 14-1 are removed up to a middle of a film thickness, and remaining portions of the $SiO_2$ insulation films become the element separation regions 14.

As a result, a portion of the activation region 12 on a side of the upper surface protrudes as the ridge portion 12a from the upper surfaces 14a of the element separation regions 14. An embedded portion 12b of the activation region 12 is embedded between the element separation regions 14. The edge portion 12a preferably has a width of 15 nm in a direction perpendicular to the longitudinal direction of the activation region 12, and a height of 50 nm from the upper surfaces 14a of the element separation regions 14, different according to a device development generation. Note that the selective etching may be performed through either dry or wet.

In the third step, a precursor gate insulation film 16-1 and a gate electrode layer 18-1 are formed to obtain a structure shown in FIG. 3(C). More specifically, the precursor gate insulation film 16-1 and a gate electrode material are sequentially deposited, so that the precursor gate insulation film 16-1 and the gate electrode layer 18-1 cover the ridge portion 12a of the activation region 12 and exposed surfaces of the element separation regions 14. Then, a surface of the gate electrode material is flattened to form the gate electrode layer 18-1.

In the embodiment, the precursor gate insulation film 16-1 is formed with a well-known thermal oxidation method or a CVD (Chemical Vapor Deposition) method to have a thickness of about 10 nm. A material of tungsten type is deposited as the gate electrode material, and is flattened with a well-known CMP method or an etch back method to form the gate electrode layer 18-1 having a thickness of about 100 nm.

In the fourth step, the gate insulation film 16 and the gate electrode 18 are formed to obtain a structure shown in FIG. 4(A). More specifically, the precursor gate insulation film 16-1 and the gate electrode layer 18-1 are patterned or etched through a patterning process. Note that the ridge portion 12a is not etched during the patterning process.

After the patterning process, a laminated member of the gate insulation film 16 and the gate electrode 18 is formed. The laminated member extends in a direction perpendicular to the longitudinal direction of the ridge portion 12a of the activation region 12 arranged in the stripe pattern. Further, the laminated member straddles the upper surface 12aa of the ridge portion 12a of the activation region 12, and covers at least a part of the side surfaces 12ab of the ridge portion 12a of the activation region 12 and the element separation regions 14.

In the patterning process of the precursor gate insulation film 16-1 and the gate electrode layer 18-1, an SiN film or an $SiO_2$ film is preferably deposited on the gate electrode layer 18-1 thus flattened with a well-known CVD method. Then, the SiN film or the $SiO_2$ film is patterned in a shape of the gate electrode 18 through photolithography technique. Afterward, the precursor gate insulation film 16-1 and the gate electrode layer 18-1 are sequentially etched with an RIE (Reactive Ion Etching) method with the SiN film or the $SiO_2$ film thus patterned as a mask. Accordingly, the gate insulation film 16 and the gate electrode 18 are formed. After etching, the SiN film or the $SiO_2$ film used as the mask is removed.

In the fifth step, the channel forming regions 20 are defined in the surface layer region of the ridge portion 12a of the activation region 12 at locations facing the gate electrode 18 (refer to FIGS. 2(A) and 2(B)). More specifically, the channel forming regions 20 are defined in the surface layer region of the ridge portion 12a of the activation region 12, i.e., the upper surface 12aa of the ridge portion 12a and the side surfaces 12ab of the ridge portion 12a, at three locations facing the gate electrode 18.

In the sixth step, an impurity is diffused toward inside the ridge portion 12a from surfaces of the channel forming regions 20 at the three locations in the upper surface 12aa of the ridge portion 12a and the side surfaces 12ab of the ridge portion 12a on the both sides in the longitudinal direction of the ridge portion 12a, thereby forming the extension regions 22 (refer to FIGS. 2(A) and 2(B)).

More specifically, the impurity such as arsenic (As) is diffused with the gate electrode 18 and the gate insulation film 16 as a mask at a carrier concentration of $1 \times 10^{18}$ cm$^{-3}$. It is necessary to provide the extension regions 22 for electric field relaxation between a source region 30 and a drain region 32 as a transistor operation. In the semiconductor non-volatile memory cell, the extension regions 22 function as a first resistivity changing portion and a second resistivity changing portion (refer to an explanation of a conventional semiconductor non-volatile memory cell having a planer structure in the section of BACKGROUND OF THE INVENTION AND RELATED ART STATEMENT).

In the seventh step, a precursor electric charge accumulation layer 26-1 and a sidewall insulation film 28-1 are sequentially deposited to cover the gate electrode 18, the ridge portion 12a of the activation region 12 including the extension regions 22, and the element separation regions 14, thereby obtaining a structure shown in FIG. 4(B).

In the embodiment, the precursor electric charge accumulation layer 26-1 is deposited with a CVD method and the likes to form an ONO laminated insulation film formed of three layers of a silicon oxide film 23-1, a silicon nitride film 24-1, and a silicon oxide film 25-1. The sidewall insulation film 28-1 is deposited using a silicon nitride film with a CVD method and the likes.

In the embodiment, in the precursor electric charge accumulation layer 26-1, the silicon oxide film 23-1 has a thickness of 6.5 nm; the silicon nitride film 24-1 has a thickness of 5.0 nm; and the silicon oxide film 25-1 has a thickness of 6.5 nm. The sidewall insulation film 28-1 has a thickness of 30 nm.

In the eighth step, the precursor electric charge accumulation layer 26-1 and the sidewall insulation film 28-1 are patterned to form a laminated member of the electric charge accumulation layers 26 capable of accumulating electric charges and the sidewalls 28 on the extension regions 22 and the side surfaces of the gate electrode 18 (refer to FIGS. 1, 2(A) and 2(B)).

More specifically, in forming the electric charge accumulation layers 26 and the sidewalls 28, a structure of the gate electrode 18, the electric charge accumulation layers 26, and the sidewalls 28 is formed in a shape shown in FIG. 1 as a whole through photolithography technique and an anisotropy etching method.

In the embodiment, the semiconductor non-volatile memory cell 100 is characterized in that the gate electrode 18 is disposed to straddle the ridge portion 12a of the activation region 12, and the electric charge accumulation layers 26 are disposed on the side surfaces of the gate electrode 18. In other words, the semiconductor non-volatile memory cell 100 has the configuration, in which the electric charge accumulation layers are integrated on side surfaces of a gate electrode of a fin-type transistor (refer to the section of BACKGROUND OF THE INVENTION AND RELATED ART STATEMENT).

In the embodiment, a ninth step may be added. In the ninth step, an impurity is diffused toward inside the ridge portion 12a from surfaces of the extension regions 22 at three locations in the upper surface 12aa of the ridge portion 12a of the activation region 12 and the side surfaces 12ab of the ridge portion 12a on the both sides in the longitudinal direction of the ridge portion 12a, thereby forming the source region 30 and the drain region 32 (refer to FIGS. 2(A) and 2(B)).

In the embodiment, the source region 30 and the drain region 32 are formed in the activation region 12 with the structure having the shape in FIG. 1 and formed in the eighth step as a mask. An impurity of arsenic (As) is diffused in the source regions 30 and the drain regions 32 at a carrier concentration of $1 \times 10^{21}$ cm$^{-3}$.

Figure 5:
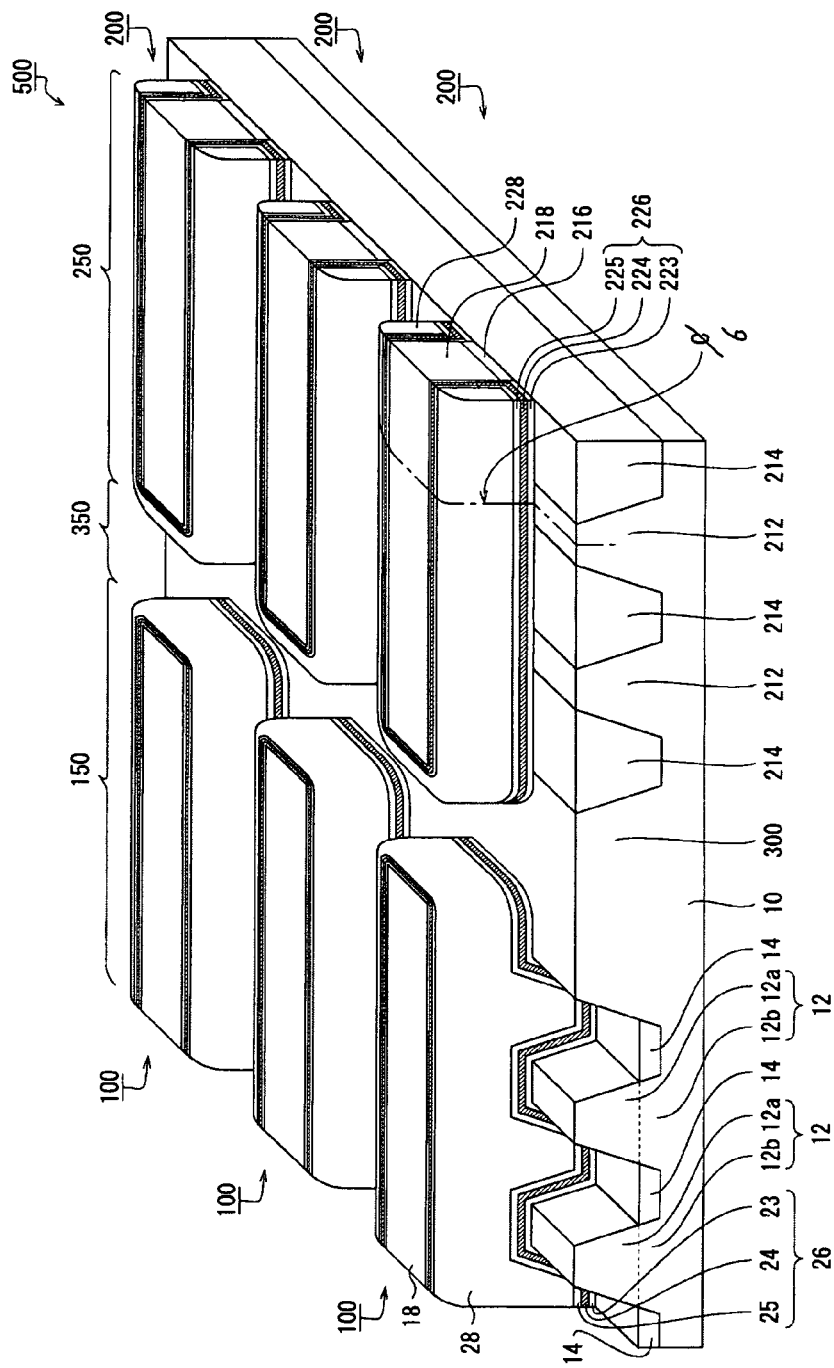
FIG. 5 is a schematic view showing a semiconductor non-volatile memory according to the embodiment of the present invention.

A configuration of a semiconductor non-volatile memory 500 will be explained next with reference to FIGS. 5 and 6. FIG. 5 is a schematic view showing the semiconductor non-volatile memory 500 according to the embodiment of the present invention.

As shown in FIG. 5, the semiconductor non-volatile memory 500 has a memory cell region 150 having a plurality of the semiconductor non-volatile memory cells 100 arranged in a matrix pattern; a peripheral region 250 having a plurality of peripheral transistors 200 arranged in a matrix pattern; and a dummy region 350 having a dummy activation region 300 formed between the memory cell region 150 and the peripheral region 250. In the semiconductor non-volatile memory 500, the memory cell region 150, the peripheral region 250, and the dummy region 350 are formed on the Si layer containing substrate 10 together. An Si substrate or an SOI substrate may be used as the Si layer containing substrate 10, and the Si substrate is explained in the following description.

In the embodiment, the semiconductor non-volatile memory cell 100 of the semiconductor non-volatile memory 500 has the configuration described above with reference to FIG. 1, and an explanation thereof is omitted. In FIG. 5, components of the semiconductor non-volatile memory cell 100 similar to those in FIG. 1 are designated with the same reference numerals.

Note that, however, in the following description, the components of the semiconductor non-volatile memory cell 100 are referred to those of the semiconductor non-volatile memory 500 as follows: the activation region is referred to as a first activation region; the element separation region is referred to as a first element separation region; the gate insulation film is referred to as a first gate insulation film; the gate electrode is referred to as a first gate electrode; the channel forming region is referred to as a first channel forming region; the extension region is referred to as a first extension region; the sidewall is referred to as a first sidewall; the source region is referred to as a first source region; and the drain region is referred to as a first drain region.

A configuration of the peripheral transistor 200 in the semiconductor non-volatile memory 500 will be explained with reference to FIGS. 5 and 6. FIG. 6 is a schematic sectional view showing the peripheral transistor 200 according to the embodiment of the present invention taken along a line 6 in FIG. 5.

In the embodiment, the peripheral transistor 200 of the semiconductor non-volatile memory 500 has a plane structure including the Si layer containing substrate 10; a second gate electrode 218; a second channel forming region 220; second extension regions 222; laminated layer films 226; and second sidewalls 228.

As shown in FIG. 5, in the peripheral region 250 of the Si layer containing substrate 10, second activation regions 212 integrated with the Si layer containing substrate 10 are arranged in a stripe pattern. More specifically, the second activation regions 212 are arranged in parallel to each other, and further in parallel to the activation regions 12. Second element separation regions 214 are formed on the Si layer containing substrate 10 on both sides of the second activation regions 212 using SiO$_2$ with a well-known STI method. In the second element separation regions 214, SiO$_2$ is embedded up to a height same as upper surfaces of the second activation regions 212. According to a device design, the second activation regions 212 preferably have a width of about 15 nm in a direction perpendicular to a strip direction of the upper surfaces thereof.

In the embodiment, the second gate electrodes 218 are disposed in a direction perpendicular to the strip direction of the second activation regions 212, and cover the upper surfaces of the second activation regions 212 and parts of the upper surfaces of the second element separation regions 214 with second gate insulation films 216 inbetween (refer to FIG. 5).

Figure 6:
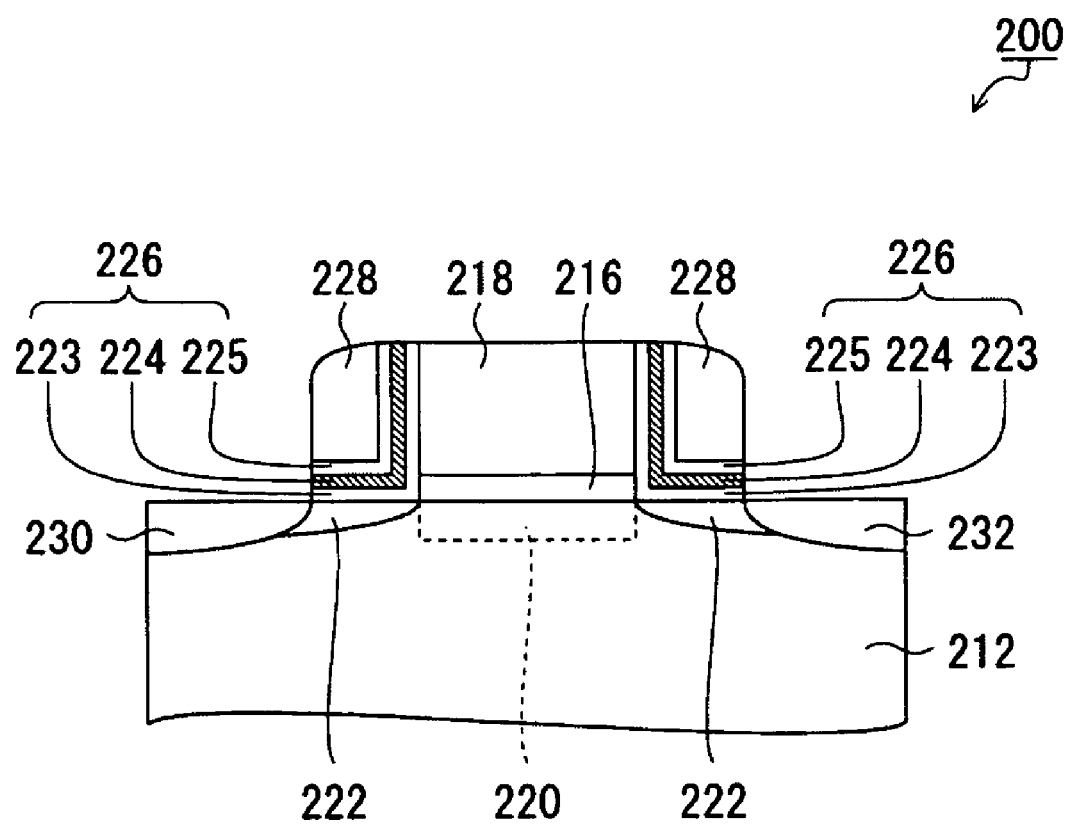
FIG. 6 is a schematic sectional view showing a peripheral transistor according to the embodiment of the present invention taken along a line 6 in FIG. 5.

In the embodiment, as shown in FIG. 6, the second channel forming region 220 is disposed in a surface layer of the second activation region 212 at positions facing the second gate electrode 218. Further, the second extension regions 222 are disposed on both sides of the second channel forming region 220 in a longitudinal direction of the second activation regions 212.

In the embodiment, a second impurity such as arsenic (As) is diffused in the second extension regions 222 at a carrier concentration of $1 \times 10^{19}$ cm$^{-3}$. Note that the second extension regions 222 function as LDD (Lightly Doped Drain) regions as a transistor operation, and it is necessary to provide the second extension regions 222 for electric field relaxation between a second source region 230 and a second drain region 232. Accordingly, the second extension regions 222 of the peripheral transistor 200 function differently from the extension regions 22 of the semiconductor non-volatile memory cell 100.

In the embodiment, the laminated layer films 226 and the second sidewalls 228 are sequentially laminated on the second extension regions 222 and side surfaces of the second gate electrode 218. Each of the laminated layer films 226 is an ONO laminated insulation film formed of three layers of a silicon oxide film 223, a silicon nitride film 224, and a silicon oxide film 225 (refer to FIGS. 5 and 6).

In the embodiment, the silicon oxide film 223 has a thickness of 6.5 nm; the silicon nitride film 224 has a thickness of 5.0 nm; and the silicon oxide film 225 has a thickness of 6.5 nm. The second sidewalls 228 are formed of a silicon nitride film having a thickness of 30 nm. Note that the laminated layer films 226 have the configuration same as that of the electric charge accumulation layers 26 in the semiconductor non-volatile memory cell 100, however, do not function for accumulating electric charges.

In the embodiment, the second source region 230 and the second drain region 232 are formed in the second activation region 212 on the both sides of the second extension regions 222, respectively (refer to FIG. 6). A third impurity of arsenic (As) is diffused in the source regions 30 and the drain regions 32 at a carrier concentration of $1 \times 10^{21}$ cm$^{-3}$.

In the embodiment, the dummy activation region 300 is disposed in the dummy region 350, i.e., the intermediate region between the memory cell region 150 and the peripheral region 250. More specifically, the dummy activation region 300 is arranged in a strip pattern in parallel to the second element separation regions 214 and the second activation regions 212 of the peripheral transistors 200, and has an upper surface at a same level as those of the second element separation regions 214 and the second element separation regions 214 (refer to FIG. 5).

In the semiconductor non-volatile memory 500, the electric charge accumulation layers 26 and the first sidewalls 28 of the semiconductor non-volatile memory cell 100 are separated from the laminated layer films 226 and the second sidewalls 228 of the peripheral transistors 200 on the dummy activation region 300 having a flat surface without a step (refer to FIG. 5).

A method of producing the semiconductor non-volatile memory 500 will be explained next with reference to FIGS. 1, 2(A), 2(B) and 5 to 11. In the following description, the components of the semiconductor non-volatile memory cell 100 and the semiconductor non-volatile memory 500 described above are designated with the same reference numerals.

Figure 7:
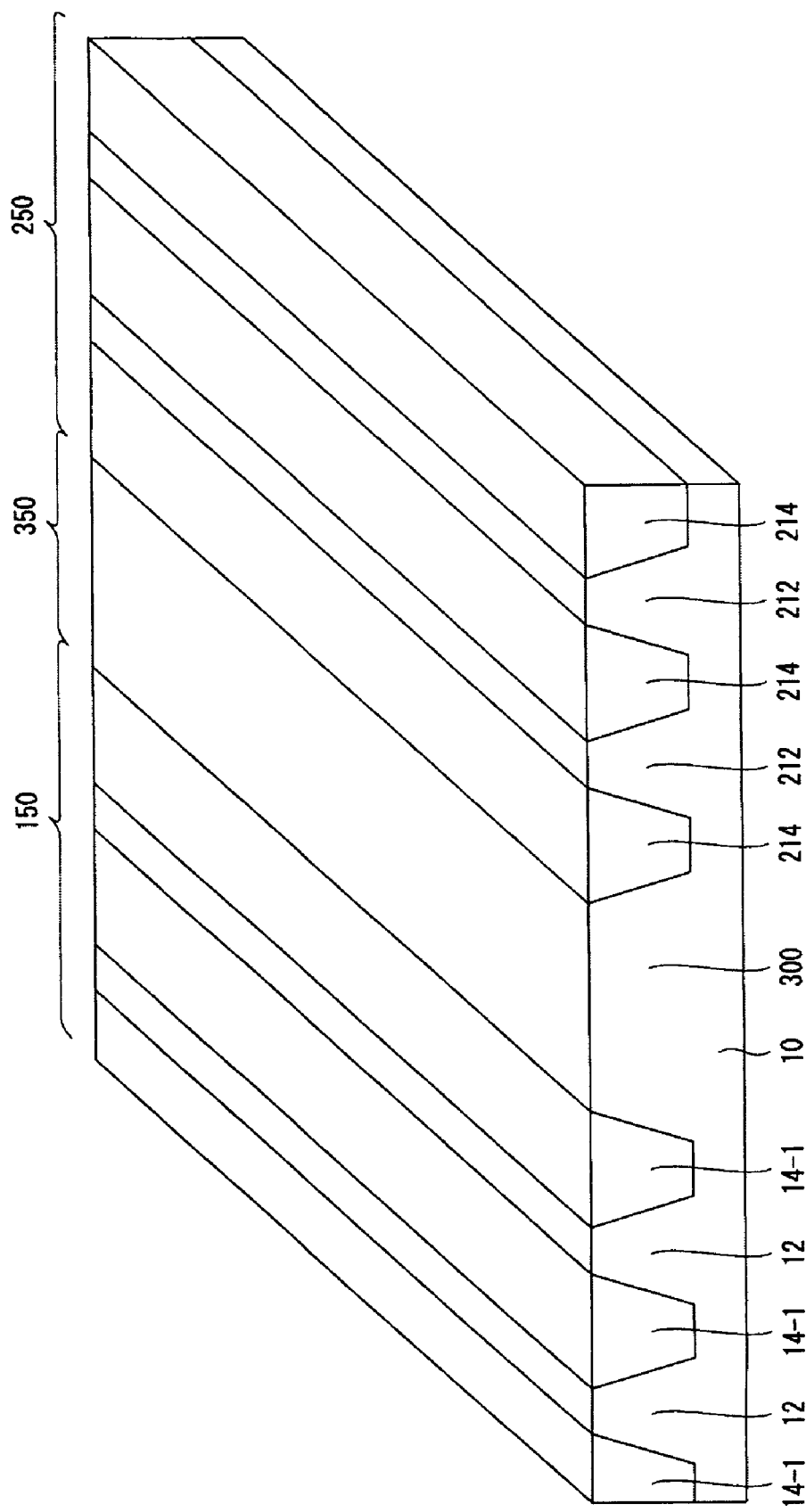
FIG. 7 is a schematic view No. 1 showing the semiconductor non-volatile memory during a manufacturing process thereof according to the embodiment of the present invention.
Figure 8:
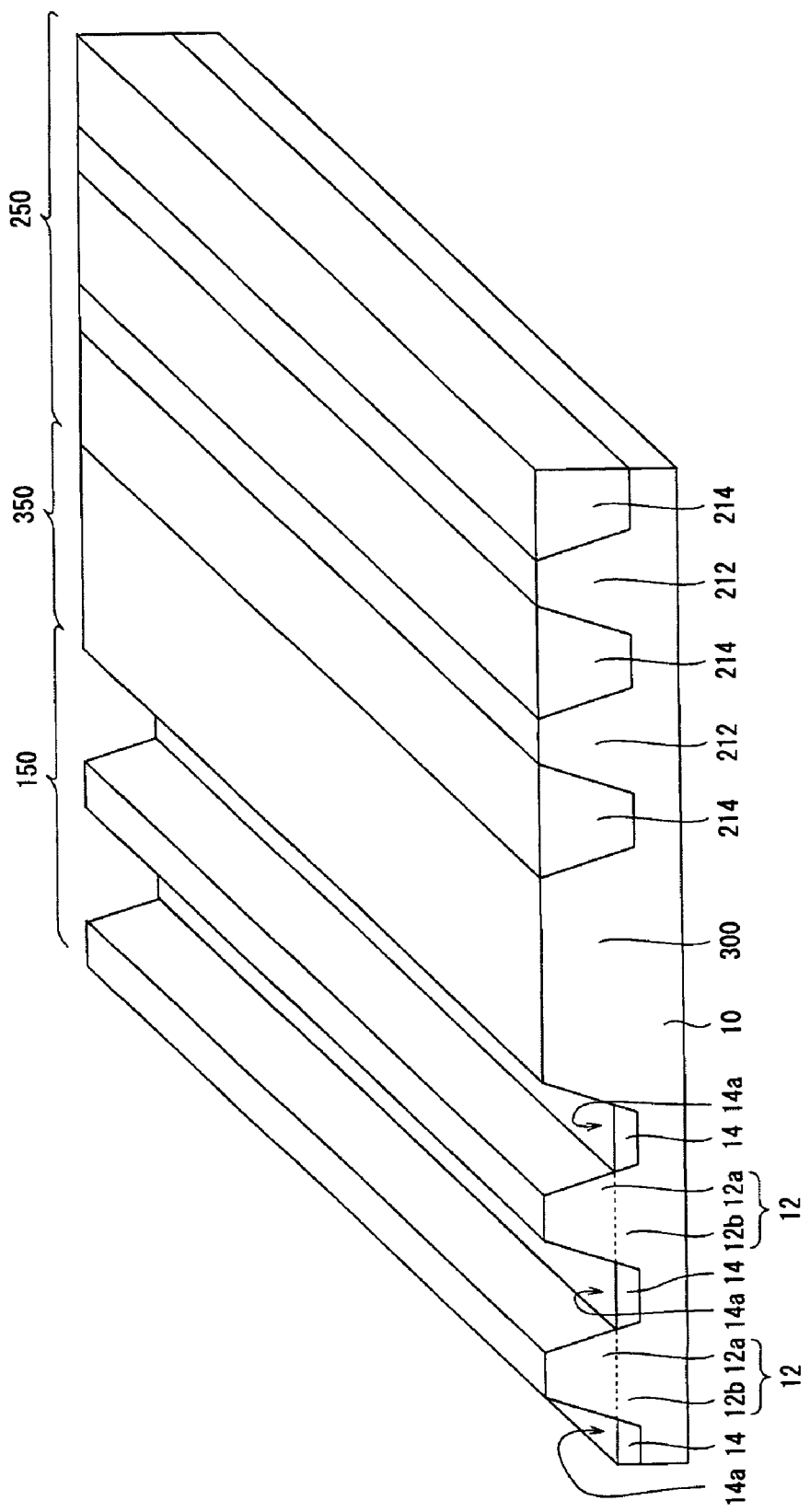
FIG. 8 is a schematic view No. 2 showing the semiconductor non-volatile memory during the manufacturing process thereof according to the embodiment of the present invention.
Figure 9:
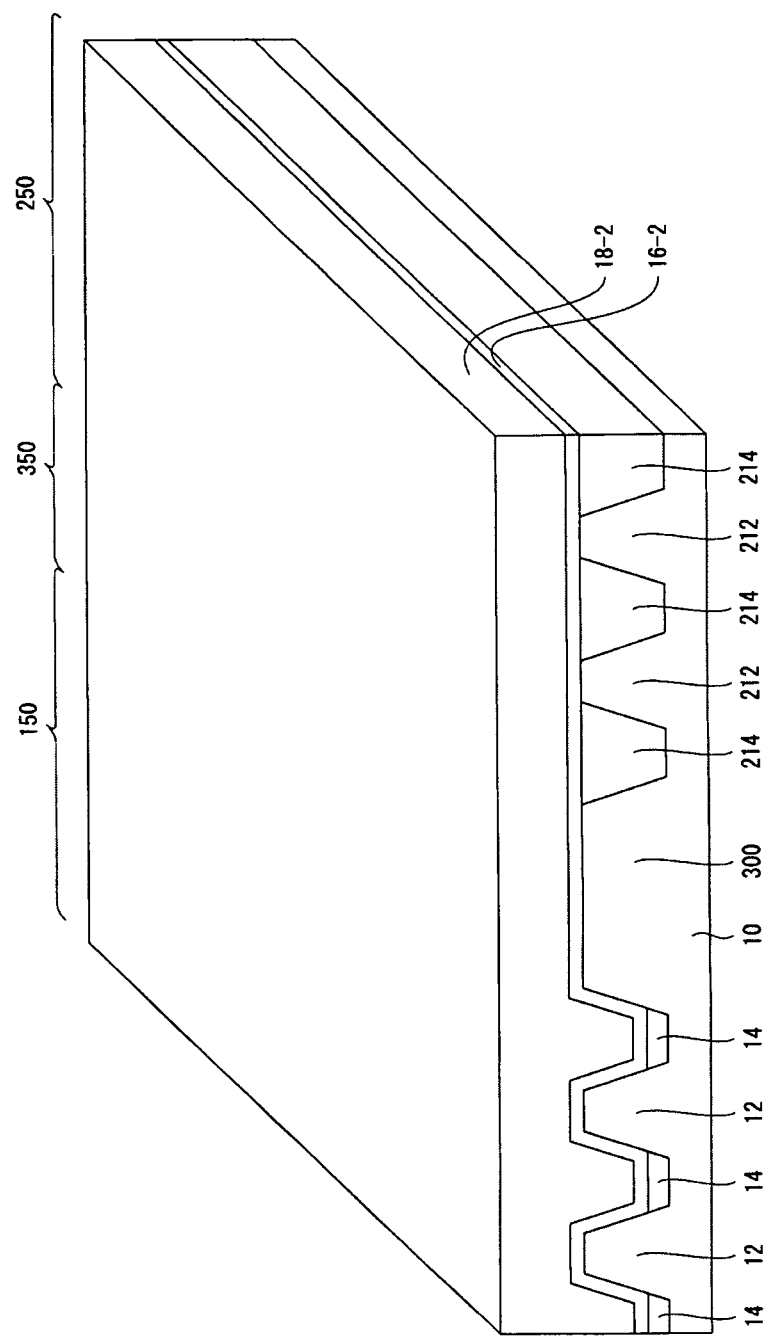
FIG. 9 is a schematic view No. 3 showing the semiconductor non-volatile memory during the manufacturing process thereof according to the embodiment of the present invention.
Figure 10:
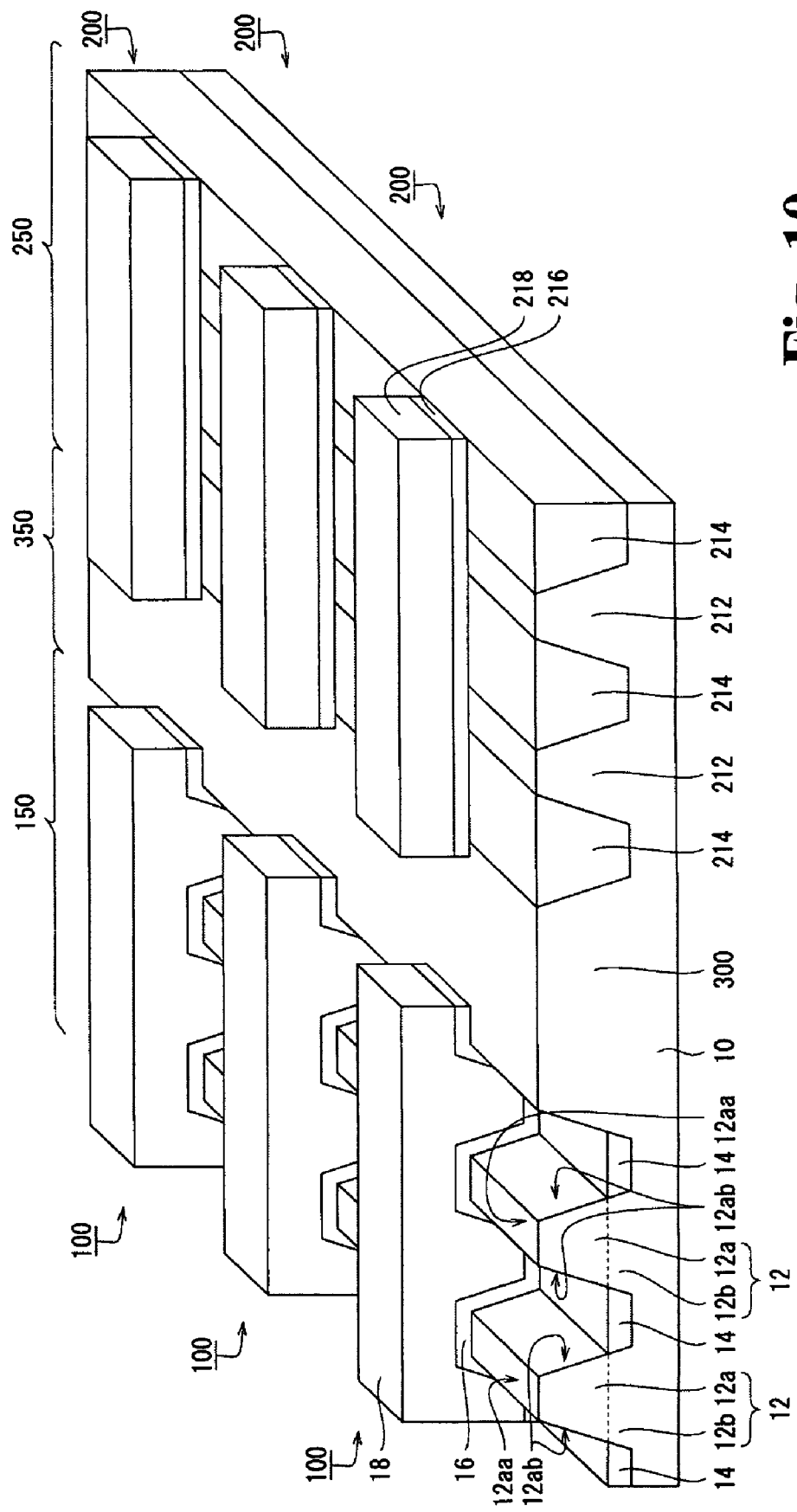
FIG. 10 is a schematic view No. 4 showing the semiconductor non-volatile memory during the manufacturing process thereof according to the embodiment of the present invention.
Figure 11:
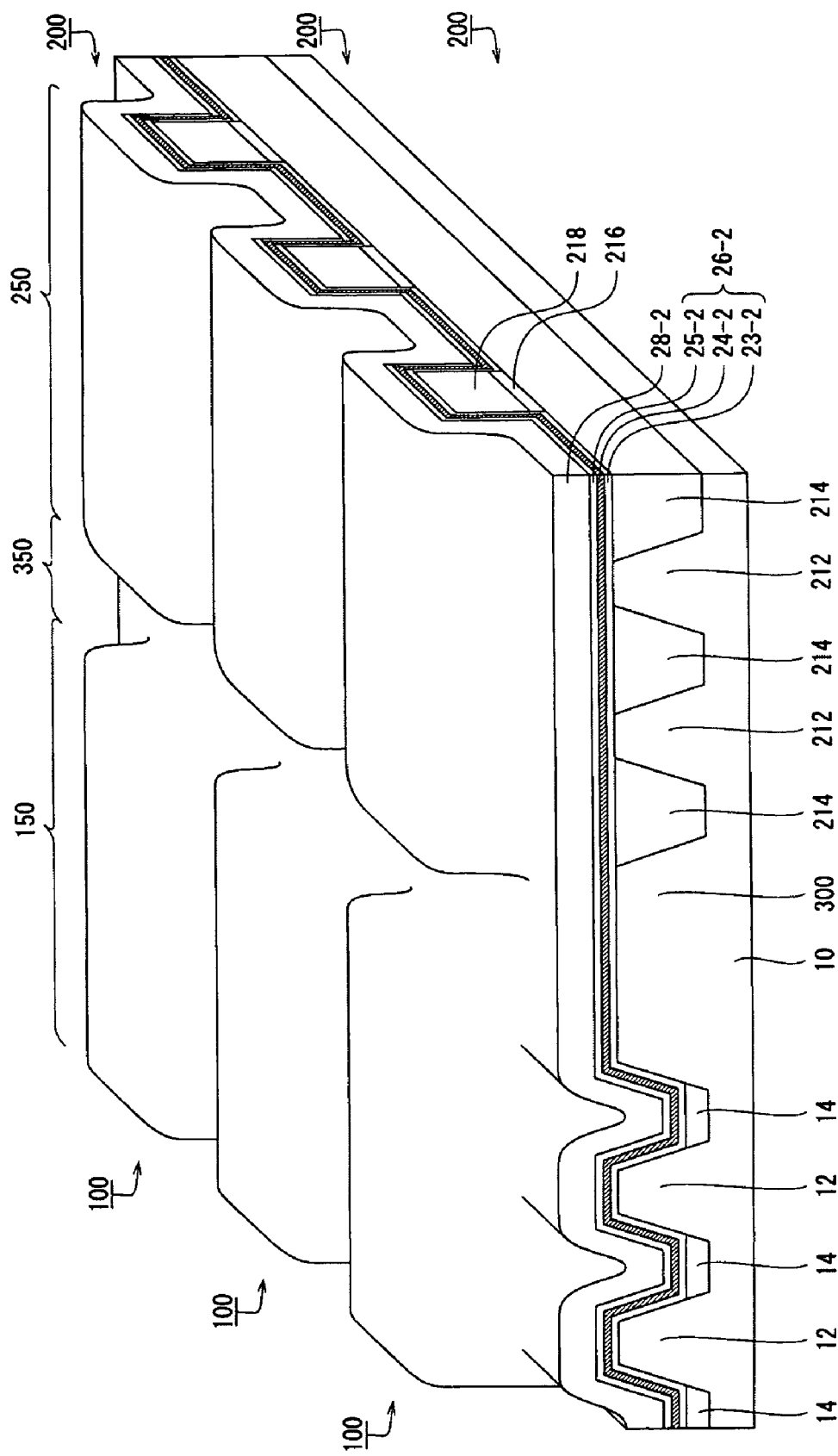
FIG. 11 is a schematic view No. 5 showing the semiconductor non-volatile memory during the manufacturing process thereof according to the embodiment of the present invention.
Figure 12:
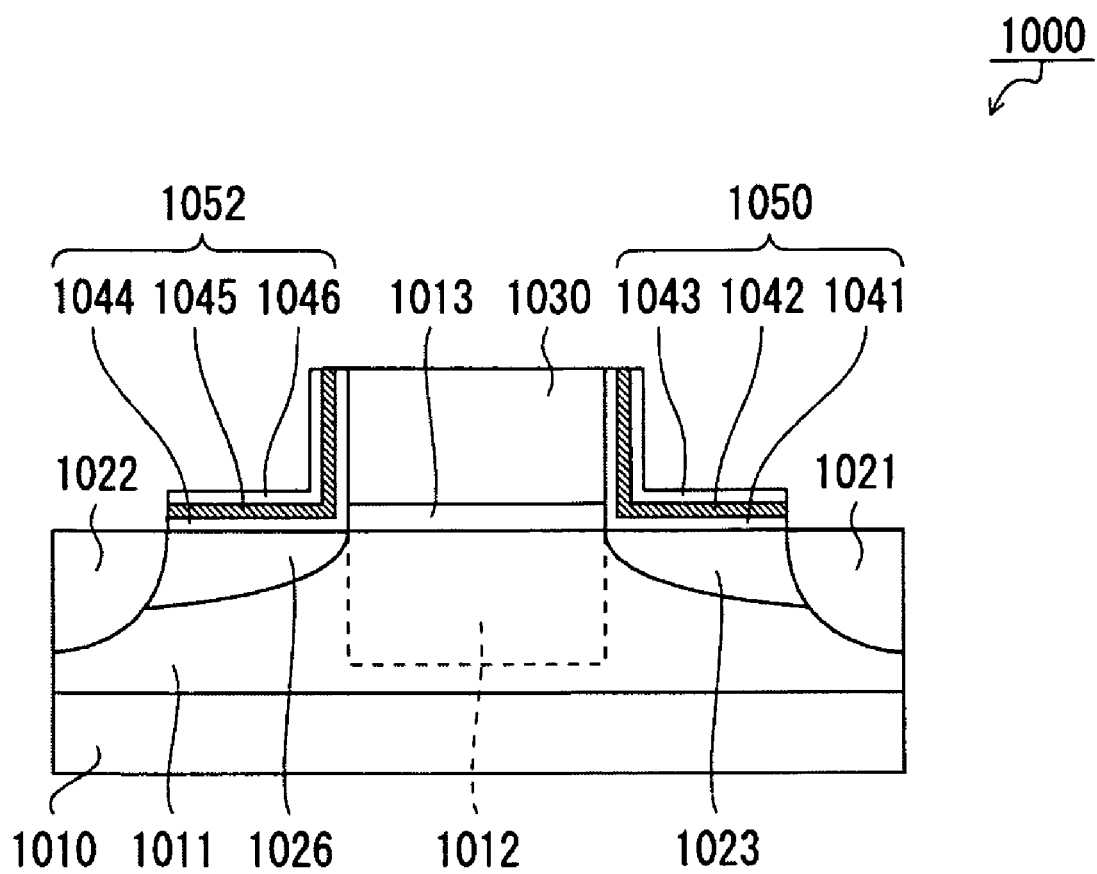
FIG. 12 is a schematic sectional view showing a conventional semiconductor non-volatile memory cell having a planer structure.
Figure 13:
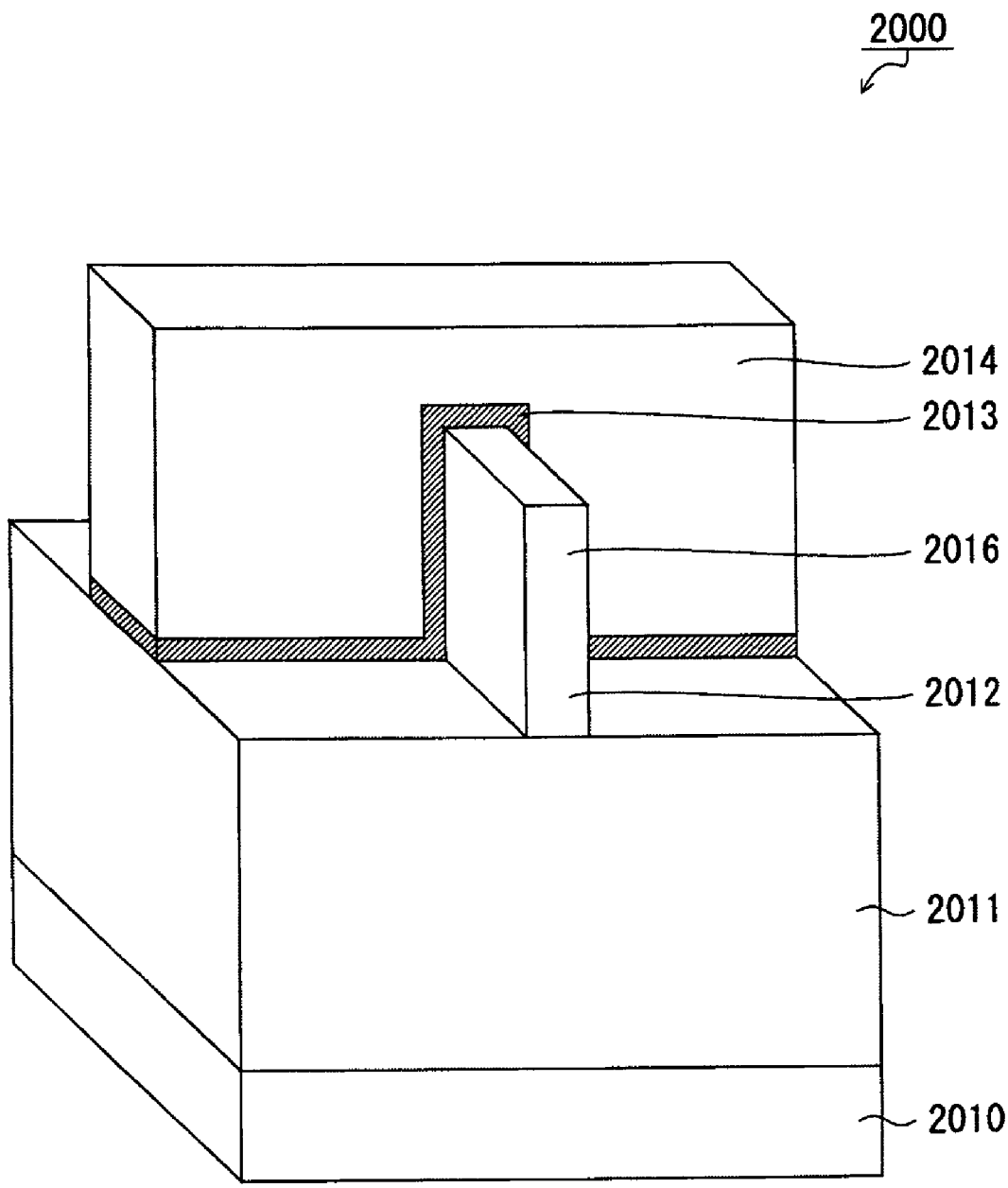
FIG. 13 is a schematic perspective view showing a fin-type transistor as an example of a conventional non-volatile memory cell having a three-dimensional structure.

FIG. 7 is a schematic view No. 1 showing the semiconductor non-volatile memory 500 during a manufacturing process thereof according to the embodiment of the present invention. FIG. 8 is a schematic view No. 2 showing the semiconductor non-volatile memory 500 during the manufacturing process thereof according to the embodiment of the present invention. FIG. 9 is a schematic view No. 3 showing the semiconductor non-volatile memory 500 during the manufacturing process thereof according to the embodiment of the present invention. FIG. 10 is a schematic view No. 4 showing the semiconductor non-volatile memory 500 during the manufacturing process thereof according to the embodiment of the present invention. FIG. 11 is a schematic view No. 5 showing the semiconductor non-volatile memory 500 during the manufacturing process thereof according to the embodiment of the present invention.

Note that, in the following description, the components of the semiconductor non-volatile memory cell 100, which are described in the method of producing the semiconductor non-volatile memory cell 100 with reference to FIGS. 1 to 4(A)-4(B), are referred to those of the semiconductor non-volatile memory 500 described in the method of producing the semiconductor non-volatile memory 500 as follows: the activation region is referred to as the first activation region; the element separation region is referred to as the first element separation region; the gate insulation film is referred to as the first gate insulation film; the gate electrode is referred to as the first gate electrode; the channel forming region is referred to as the first channel forming region; the extension region is referred to as the first extension region; the sidewall is referred to as the first sidewall; the source region is referred to as the first source region; and the drain region is referred to as the first drain region.

The method of producing the semiconductor non-volatile memory 500 includes first to tenth steps.

In a preparation step, the Si layer containing substrate 10 is prepared first. The upper surface of the Si layer containing substrate 10 is defined to have the memory cell region 150, the peripheral region 250, and the dummy region 350, i.e., the intermediate region between the memory cell region 150 and the peripheral region 250. More specifically, the memory cell region 150 having a plurality of the semiconductor non-volatile memory cells 100 arranged in a matrix pattern; the peripheral region 250 having a plurality of the peripheral transistors 200 arranged in a matrix pattern; and the dummy region 350 having the dummy activation region 300 formed between the memory cell region 150 and the peripheral region 250 are defined on the Si layer containing substrate 10 together. An Si substrate or an SOI substrate may be used as the Si layer containing substrate 10, and the Si substrate is explained in the following description.

In the first step, the precursor first element separation regions 14-1 formed of the first activation regions 12 having the ridge shape and the first embedded insulation films embedded on the both sides of the first activation regions 12 are formed in the memory cell region 150. Further, the dummy activation region 300 having the ridge shape is formed in the dummy region 350. Further, the second element separation regions 214 formed of the second activation regions 212 having the ridge shape and second embedded insulation films embedded on both sides of the second activation regions 212 are formed in the peripheral region 250 in the stripe pattern (refer to FIG. 7).

In the embodiment, the precursor first element separation regions 14-1 and the second element separation regions 214 are formed with a well-known STI method and a CMP (Chemical Mechanical Polishing) method. More specifically, a surface of the Si layer containing substrate 10 is processed to form the first activation regions 12, the dummy activation region 300, and the second activation regions 212 having the ridge shapes in the stripe patterns in parallel to with each other. Afterward, $SiO_2$ insulation films are embedded on the both sides of the first activation regions 12 and the second activation regions 212 to form the precursor element separation regions 14-1 and the second element separation regions 214, thereby obtaining a structure shown in FIG. 7.

In the second step, the precursor element separation regions 14-1 are selectively etched from an upper surface thereof up to a middle of a depth thereof, thereby forming the first element separation regions 14. Further, portions of the first activation regions 12 on a side of upper surfaces thereof protrude, thereby obtaining a structure shown in FIG. 8. Through etching selectively, the $SiO_2$ insulation films forming the precursor element separation regions 14-1 are removed up to a middle of a film thickness, and remaining portions of the $SiO_2$ insulation films become the first element separation regions 14.

As a result, the portions of the first activation regions 12 on the side of the upper surfaces thereof protrude as the ridge portions 12a from the upper surfaces 14a of the first element separation regions 14. The embedded portions 12b of the first activation regions 12 are embedded between the first element separation regions 14. The edge portions 12a preferably have a width of 15 nm in a direction perpendicular to the longitudinal direction of the first activation regions 12, and a height of 50 nm from the upper surfaces 14a of the first element separation regions 14, different according to a device development generation (refer to FIG. 8). Note that the selective etching may be performed through either dry or wet.

In the third step, a gate insulation layer 16-2 and a gate electrode material are sequentially deposited to cover exposed surfaces of the memory cell region 150, the dummy region 350, and the peripheral region 250. Then, a surface of the gate electrode material is flattened to form the gate electrode layer 18-2, thereby obtaining a structure shown in FIG. 9.

In the embodiment, the gate insulation layer 16-2 is formed with a well-known thermal oxidation method or a CVD (Chemical Vapor Deposition) method using an $SiO_2$ film to have a thickness of about 10 nm. A material of tungsten type is deposited as the gate electrode material, and is flattened with a well-known CMP method or an etch back method to form the gate electrode layer 18-2 having a thickness of about 100 nm.

In the fourth step, portions of the gate insulation layer 16-2 and the gate electrode layer 18-2 in the peripheral region 250 and the dummy region 350 adjacent to the peripheral region 250 are patterned through a patterning process, thereby obtaining a structure shown in FIG. 10. In the structure, the second gate insulation films 216 and the second gate electrodes 218 are formed along the direction perpendicular to the longitudinal direction of the second activation regions 212 to cover at least a part of the second activation regions 212, the second element separation regions 214, and the dummy activation region 300. To this end, the gate insulation layer 16-2 and the gate electrode layer 18-2 are patterned through the patterning process.

In the patterning process of the gate insulation layer 16-2 and the gate electrode layer 18-2, preferably, an SiN film or an SiO$_2$ film is deposited on the gate electrode layer 18-2 thus flattened with a well-known CVD method. Then, the SiN film or the SiO$_2$ film is patterned in a shape of the second gate electrodes 218 through photolithography technique. Afterward, the gate insulation layer 16-2 and the gate electrode layer 18-2 are sequentially etched with an RIE (Reactive Ion Etching) method with the SiN film or the SiO$_2$ film thus patterned as a mask. Accordingly, the second gate insulation films 216 and the second gate electrodes 218 are formed. After etching, the SiN film or the SiO$_2$ film used as the mask is removed.

In the fifth step, remaining portions of the gate insulation layer 16-2 and the gate electrode layer 18-2 in the memory cell region 150 and the dummy region 350 adjacent to the memory cell region 150 are patterned through a patterning process, thereby obtaining a structure shown in FIG. 10. In the structure, the first gate insulation films 16 and the first gate electrodes 18 are formed along the direction perpendicular to the longitudinal direction of the second activation regions 212 to straddle the upper surfaces 12aa of the ridge portions 12a, and cover at least parts of the side surfaces 12ab of the ridge portions 12a, the first element separation regions 14, and the dummy activation region 300. To this end, the gate insulation layer 16-2 and the gate electrode layer 18-2 are patterned through the patterning process. Note that the ridge portions 12a are not etched during the patterning process.

In the patterning process of the gate insulation layer 16-2 and the gate electrode layer 18-2, preferably, an SiN film or an SiO$_2$ film is deposited on the gate electrode layer 18-2 thus flattened with a well-known CVD method. Then, the SiN film or the SiO$_2$ film is patterned in a shape of the first gate electrodes 18 through photolithography technique. Afterward, the gate insulation layer 16-2 and the gate electrode layer 18-2 are sequentially etched with an RIE (Reactive Ion Etching) method with the SiN film or the SiO$_2$ film thus patterned as a mask. Accordingly, the first gate insulation films 16 and the first gate electrodes 18 are formed. After etching, the SiN film or the SiO$_2$ film used as the mask is removed.

With the fourth and fifth steps, it is possible to separately form the first gate insulation films 16 and the second gate insulation films 216 on the dummy activation region 300 having the flat surface without a step, and further to separately form the first gate electrodes 18 and the second gate electrode 218. Accordingly, it is possible to prevent a portion of the film removed through the etching from adhering again.

In the sixth step, the first channel forming regions 20 are defined in the surface layer regions of the ridge portions 12a of the first activation regions 12 at locations facing the first gate electrodes 18. Further, the second channel forming regions 220 are defined in the surface layer regions of the second activation regions 212 at positions facing the second gate electrodes 218 (refer to FIGS. 2(A), 2(B) and 6).

More specifically, the first channel forming regions 20 are defined in the surface layer regions of the ridge portions 12a of the activation region 12s, i.e., the upper surfaces 12aa of the ridge portions 12a and the side surfaces 12ab of the ridge portions 12a, at three locations facing the first gate electrodes 18 (refer to FIGS. 2(A) and 2(B)). Further, the second channel forming regions 220 are defined in the surface layer regions of the second activation regions 212 at positions facing the second gate electrodes 218 (refer to FIG. 6).

In the seventh step, the first impurity is diffused into the first activation regions 12 on the both sides of the first channel forming regions 20 in the longitudinal direction of the ridge portions 12a, thereby forming the first extension regions 22. Further, the second impurity is diffused into the second activation regions 212 on the both sides of the second channel forming regions 220 in the longitudinal direction of the second activation regions 212 of the second channel forming regions 220, thereby forming the second extension regions 222 (refer to FIGS. 2(A), 2(B), and 6).

More specifically, the first impurity is diffused toward inside the ridge portion 12a from surfaces of the channel forming regions 20 at the three locations in the upper surface 12aa of the ridge portion 12a and the side surfaces 12ab of the ridge portion 12a on the both sides in the longitudinal direction of the ridge portion 12a, thereby forming the first extension regions 22 (refer to FIGS. 2(A) and 2(B)).

In the first extension regions 22, the first impurity such as arsenic (As) is diffused with the first gate electrodes 18 and the first gate insulation films 16 as a mask at a carrier concentration of $1 \times 10^{18}$ cm$^{-3}$. It is necessary to provide the first extension regions 22 for electric field relaxation between a source region 30 and a drain region 32 as a transistor operation. In the semiconductor non-volatile memory cell, the extension regions 22 function as a first resistivity changing portion and a second resistivity changing portion of a conventional semiconductor non-volatile memory cell having a planer structure (refer to an explanation in the section of BACKGROUND OF THE INVENTION AND RELATED ART STATEMENT).

In the second extension regions 222, the second impurity such as phosphorous (P) is diffused with the second gate electrodes 218 and the second gate insulation films 216 as a mask at a carrier concentration of $1 \times 10^{19}$ cm$^{-3}$. Note that the second extension regions 222 function as the LDD region as a transistor operation. It is necessary to provide the first extension regions 22 for electric field relaxation between the second source regions 230 and the second drain regions 232, and the second extension regions 222 have the function different from that of the first extension regions 22.

In the eighth step, a precursor electric charge accumulation layer 26-2 and a sidewall insulation film 28-2 are sequentially deposited to cover the upper surfaces of the memory cell region 150, the peripheral region 250, and the dummy region 350, thereby obtaining a structure shown in FIG. 11.

In the embodiment, the precursor electric charge accumulation layer 26-2 is deposited with a CVD method and the likes to form an ONO laminated insulation film formed of three layers of a silicon oxide film 23-2, a silicon nitride film 24-2, and a silicon oxide film 25-2. The sidewall insulation film 28-2 is deposited using a silicon nitride film with a CVD method and the likes.

In the embodiment, in the precursor electric charge accumulation layer 26-2, the silicon oxide film 23-2 has a thickness of 6.5 nm; the silicon nitride film 24-2 has a thickness of 5.0 nm; and the silicon oxide film 25-2 has a thickness of 6.5 nm. The sidewall insulation film 28-2 has a thickness of 30 nm.

In the ninth step, portions of the precursor electric charge accumulation layer 26-2 and the sidewall insulation film 28-2 in the peripheral region 250 and the dummy region 350 adjacent to the peripheral region 250 are patterned to form the laminated layer films 226 not used for accumulating electric charges and the second sidewalls 228 on the second extension regions 222 and one or both of the side surfaces of the second gate electrode 218 opposing in the longitudinal direction of the second activation regions 212 (refer to FIGS. 5 and 6).

More specifically, in forming the laminated layer films 226 and the second sidewalls 228, the second gate electrodes 218, the laminated layer films 226, and the second sidewalls 228 are formed in a shape shown in FIG. 5 through well-known photolithography technique and an anisotropy etching method. Note that the laminated layer films 226 have the configuration same as that of the electric charge accumulation layers 26 of the semiconductor non-volatile memory cell 100, however, are not used for accumulating electric charges.

In the tenth step, remaining portions of the precursor electric charge accumulation layer 26-2 and the sidewall insulation film 28-2 in the memory cell region 150 and remaining portions of the dummy region 350 are patterned to form the electric charge accumulation layers 26 and the first sidewalls 28 on the first extension regions 22 and one or both of the side surfaces of the first gate electrodes 18 opposing in the longitudinal direction of the ridge portions 12a (refer to FIGS. 1, 2(A) and 2(B), and 5).

More specifically, in forming the electric charge accumulation layers 26 and the first sidewalls 28, the first gate electrodes 18, the electric charge accumulation layers 26, and the first sidewalls 28 are formed in a shape shown in FIG. 1 through well-known photolithography technique and an anisotropy etching method.

In the embodiment, in the method of producing the semiconductor non-volatile memory 500, the semiconductor non-volatile memory cell 100 is characterized in that the first gate electrodes 18 are disposed to straddle the ridge portions 12a of the first activation regions 12, and the electric charge accumulation layers 26 are disposed on the side surfaces of the first gate electrodes 18. In other words, in the method of producing the semiconductor non-volatile memory 500, the semiconductor non-volatile memory cell 100 has the configuration, in which the electric charge accumulation layers are integrated on side surfaces of a gate electrode of a fin-type transistor (refer to the section of BACKGROUND OF THE INVENTION AND RELATED ART STATEMENT).

With the ninth and tenth steps, it is possible to separately form the electric charge accumulation layers 26 and the laminated layer films 226 on the dummy activation region 300 having the flat surface without a step, and further to separately form the first sidewalls 28 and the second sidewalls 228. Accordingly, it is possible to prevent a portion of the film removed through the etching from adhering again.

In the embodiment, an eleventh step may be added. In the eleventh step, the third impurity is diffused into the first activation regions 12 on both sides of the first extension regions 22 to form the first source regions 30 and the first drain regions 32. Further, the third impurity is diffused into the second activation regions 212 on both sides of the second extension regions 222 to form the silicon oxide film 230 and the silicon oxide film 232 (refer to FIGS. 2(A), 2(B), and 6).

More specifically, the third impurity such as arsenic (As) is diffused toward inside the ridge portions 12a from surfaces of the first extension regions 22 at three locations in the upper surfaces 12aa of the ridge portions 12a of the first activation regions 12 and the side surfaces 12ab of the ridge portions 12a on the both sides in the longitudinal direction of the ridge portions 12a, thereby forming the first source regions 30 and the first drain regions 32 (refer to FIGS. 2(A) and 2(B)).

In the embodiment, the first source regions 30 and the first drain regions 32 are formed in the first activation regions 12 with the first gate electrodes 18, the electric charge accumulation layers 26 and the first sidewalls 28 formed in the tenth step as a diffusion mask. The third impurity of arsenic (As) is diffused in the first source regions 30 and the first drain regions 32 at a carrier concentration of $1\times10^{21}$ cm$^{-3}$.

In the embodiment, the third impurity such as arsenic (As) is diffused with the second gate electrode 218, the laminated layer films 226, and the second sidewalls 228 formed in the ninth step as a diffusion mask at a carrier concentration of $1\times10^{21}$ cm$^{-3}$, thereby forming the silicon oxide film 230 and the silicon oxide film 232

The disclosure of Japanese Patent Application No. 2007-185710, filed on Jul. 17, 2007, is incorporated in the application by reference.

While the invention has been explained with reference to the specific embodiments of the invention, the explanation is illustrative and the invention is limited only by the appended claims.

What is claimed is:

1. A semiconductor non-volatile memory comprising:
a memory cell region having a semiconductor non-volatile memory cell;
a peripheral region having a peripheral transistor; and
a dummy region having a dummy activation region,
wherein said semiconductor non-volatile memory cell includes,
an Si (silicon) layer containing substrate;
a first activation region having a ridge shape arranged in a stripe pattern, said first activation region including a ridge portion;
a first element separation region embedded in both sides of the first activation region so that the ridge portion protrudes from the first element separation region;
a first gate insulation film;
a first gate electrode disposed on the first gate insulation film and extending in a direction perpendicular to a longitudinal direction of the ridge portion, said first gate electrode formed over an upper surface of the ridge portion for covering at least a part of both side surfaces of the ridge portion and an upper surface of the first element separation region;
a first channel forming region formed in a surface layer region of the ridge portion at a position facing the first gate electrode;
a first extension region formed on both sides of the channel forming region in the longitudinal direction; and
an electric charge accumulation layer capable of accumulating electric charges and a first sidewall sequentially formed on the first extension region and one or both of side surfaces of the first gate electrode facing with each other in the longitudinal direction,
said peripheral transistor includes
a second activation region having a ridge shape and arranged on the Si layer containing substrate in a stripe pattern;
a second element separation region formed on the Si layer containing substrate and embedded in the second activation region so that the second element separation region has a height same as an upper surface of the second activation region;
a second gate insulation film disposed on the second activation region and the second element separation region and having a flat shape;
a second gate electrode formed on the second gate insulation film and extending in a direction perpendicular to a longitudinal direction of the second activation region for covering the second activation region and at least a part of the second element separation region;
a second channel forming region formed in a surface layer region of the second activation region at a position facing the second gate electrode;
a second extension region formed on both sides of the second channel forming region in the longitudinal direction; and
a laminated layer film and a second sidewall sequentially formed on the second extension region and one or both of side surfaces of the second gate electrode facing with each other in the longitudinal direction, and
said dummy activation region is formed in the dummy region as an intermediate region between the memory cell region and the peripheral region on the Si layer containing substrate, said dummy activation region being arranged in parallel to the second element separation region and the second activation region on a plane same as that of the second element separation region and the second activation region.

2. The semiconductor non-volatile memory according to claim 1, wherein said first gate insulation film and said first gate electrode are arranged separately from the second gate insulation film and the second gate electrode in the dummy activation region.

3. The semiconductor non-volatile memory according to claim 1, wherein said electric charge accumulation layer and said laminated layer film are formed of a laminated insulation film formed of three layers of a silicon oxide film, a silicon nitride film, and a silicon oxide film, respectively.

4. The semiconductor non-volatile memory according to claim 1, said electric charge accumulation layer and said first sidewall are arranged separately from the laminated layer film and the second sidewall in the dummy activation region.

5. A method of producing a semiconductor non-volatile memory, comprising the steps of:

defining a memory cell region, a peripheral region, and a dummy region as an intermediate region between the memory cell region and the peripheral region on a surface of a Si (Silicon) layer containing substrate;

forming a first activation region having a ridge shape and a precursor first element separation region formed of a first embedded insulation film embedded in both sides of the first activation region in the memory cell region in a stripe pattern, respectively forming a dummy activation region having a ridge shape in the dummy region in a stripe pattern;

forming a second activation region having a ridge shape and a second element separation region formed of a second embedded insulation film embedded in both sides of the second activation region in the peripheral region in a stripe pattern, respectively;

etching the precursor first element separation region from a surface thereof to a middle of a thickness thereof to form a first element separation region forming an upper edge portion of the first activation region to protrude as a ridge portion;

depositing sequentially a gate insulation film and a gate electrode material for covering exposed surfaces of the memory cell region, the dummy region, and the peripheral region from above;

flattening a surface of the gate electrode material to form a gate electrode layer;

patterning portions of the gate insulation film and the gate electrode layer in the peripheral region and the dummy region adjacent to the peripheral region to form a second gate insulation film having a flat shape and a second gate electrode extending perpendicularly to a longitudinal direction of the second activation region and covering at least a part of the second activation region, the second element separation region, and the dummy activation region;

patterning remaining portions of the gate insulation film and the gate electrode layer in the memory cell region and a remaining area of the dummy region to form a first gate insulation film and a first gate electrode extending perpendicularly to a longitudinal direction of the ridge portion and covering over the ridge portion and at least a part of both side surfaces of the ridge portion, the first element separation region, and the dummy activation region;

defining a first channel forming region in a surface layer region of the ridge portion at a position facing the first gate electrode;

defining a second channel forming region in a surface layer region of the second activation region at a position facing the second gate electrode;

diffusing a first impurity in the first activation region on both sides of the first channel forming region in the longitudinal direction to form a first extension region;

diffusing a second impurity in the second activation region on the both sides of the second channel forming region in the longitudinal direction to form a second extension region;

depositing sequentially a precursor electric charge accumulation layer and a sidewall insulation film for covering upper surfaces of the memory cell region, the dummy region, and the peripheral region;

patterning portions of the precursor electric charge accumulation layer and the sidewall insulation film in the peripheral region and the dummy region adjacent to the peripheral region to form a laminated layer film and a second sidewall on the second extension region and one or both of side surfaces of the second gate electrode in the longitudinal direction;

patterning remaining portions of the precursor electric charge accumulation layer and the sidewall insulation film in the memory cell region and a remaining area of the dummy region to form an electric charge accumulation layer and a first sidewall on the first extension region and one or both of side surfaces of the first gate electrode facing each other in the longitudinal direction.

6. The method of producing the semiconductor non-volatile memory according to claim 5, wherein, in the steps of patterning the portions and the remaining portions of the gate insulation film and the gate electrode layer, said first gate insulation film is arranged separately from the second gate insulation film in the dummy activation region, and said first gate electrode is arranged separately from the second gate electrode in the dummy activation region.

7. The method of producing the semiconductor non-volatile memory according to claim 5, wherein, in the step of depositing sequentially the precursor electric charge accumulation layer and the sidewall insulation film, said precursor electric charge accumulation layer is formed of a laminated insulation film formed of three layers of a silicon oxide film, a silicon nitride film, and a silicon oxide film.

8. The method of producing the semiconductor non-volatile memory according to claim 5, wherein, in the steps of patterning the portions and the remaining portions of the precursor electric charge accumulation layer and the sidewall insulation film, said electric charge accumulation layer is arranged separately from the laminated layer film in the dummy activation region, and said first sidewall is arranged separately from the second sidewall in the dummy activation region.

* * * * *